US008698099B2

(12) United States Patent
Inoue

(10) Patent No.: US 8,698,099 B2
(45) Date of Patent: Apr. 15, 2014

(54) ATTRACTION MEMBER, AND ATTRACTION DEVICE AND CHARGED PARTICLE BEAM APPARATUS USING THE SAME

(75) Inventor: Tetsuya Inoue, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 94 days.

(21) Appl. No.: 12/894,382

(22) Filed: Sep. 30, 2010

(65) Prior Publication Data

US 2011/0073776 A1  Mar. 31, 2011

(30) Foreign Application Priority Data

| Sep. 30, 2009 | (JP) | 2009-226246 |
|---|---|---|
| Sep. 30, 2009 | (JP) | 2009-226247 |
| Sep. 30, 2010 | (JP) | 2010-220892 |
| Sep. 30, 2010 | (JP) | 2010-220893 |

(51) Int. Cl.
*G21G 5/00* (2006.01)
*B23B 31/30* (2006.01)

(52) U.S. Cl.
USPC ............ 250/453.11; 250/491.1; 279/3

(58) Field of Classification Search
USPC ............ 250/491.1, 492.1, 453.11; 279/3; 414/222.01, 935
See application file for complete search history.

(56) References Cited

U.S. PATENT DOCUMENTS

| 3,272,350 | A | * | 9/1966 | Pflaumer et al. | 279/3 |
|---|---|---|---|---|---|
| 3,617,045 | A | * | 11/1971 | Da Costa et al. | 279/3 |
| 3,627,338 | A | * | 12/1971 | Thompson | 279/3 |
| 3,729,206 | A | * | 4/1973 | Cachon et al. | 279/3 |
| 3,794,314 | A | * | 2/1974 | Coburn et al. | 279/3 |
| 3,993,018 | A | * | 11/1976 | Kranik et al. | 250/492.1 |
| 4,906,011 | A | * | 3/1990 | Hiyamizu et al. | 279/3 |
| 5,421,595 | A | * | 6/1995 | Cripe et al. | 279/3 |
| 5,536,559 | A | * | 7/1996 | Cerrina et al. | 279/3 |
| 5,563,683 | A | * | 10/1996 | Kamiya | 355/53 |
| 5,857,667 | A | * | 1/1999 | Lee | 279/3 |
| 5,923,408 | A | * | 7/1999 | Takabayashi | 355/53 |
| 5,966,203 | A | * | 10/1999 | Bowen | 355/73 |
| 6,264,185 | B1 | * | 7/2001 | Isobe et al. | 269/21 |
| 6,371,430 | B1 | * | 4/2002 | Vernackt | 248/362 |
| 6,375,176 | B1 | * | 4/2002 | Getchel et al. | 269/21 |
| 6,583,858 | B2 | * | 6/2003 | van Schaik et al. | 355/72 |
| 6,644,703 | B1 | * | 11/2003 | Levin et al. | 279/3 |
| 6,692,219 | B2 | * | 2/2004 | Coomer et al. | 414/754 |
| 6,965,226 | B2 | * | 11/2005 | Dunklee | 324/756.01 |
| 7,010,852 | B2 | * | 3/2006 | Ogimoto | 29/740 |
| 7,108,471 | B2 | * | 9/2006 | Osuga | 414/222.01 |
| 7,275,749 | B2 | * | 10/2007 | Matsuzawa et al. | 279/106 |
| 7,396,022 | B1 | * | 7/2008 | Moghadam et al. | 279/3 |
| 2002/0064450 | A1 | * | 5/2002 | Coomer et al. | 414/939 |

(Continued)

FOREIGN PATENT DOCUMENTS

JP  09-283605  10/1997

*Primary Examiner* — David A Vanore
*Assistant Examiner* — Wyatt Stoffa
(74) *Attorney, Agent, or Firm* — Volpe and Koenig, P.C.

(57) ABSTRACT

A chucking member for holding a target is removably mounted on a chucking stage with a plurality of vacuum holes. the chucking member has a substrate removably mounted on the chucking stage. The substrate has a vacuum region in which the target being to be arranged, the vacuum region allowing gas to be vacuumed through a part of the plurality of the vacuum holes, and a vacuum inhibition region provided around the vacuum region, the vacuum inhibition region covering the other of the vacuum holes to inhibit the gas from being vacuumed through the other of the vacuum holes.

18 Claims, 19 Drawing Sheets

(56) References Cited

U.S. PATENT DOCUMENTS

| | | | |
|---|---|---|---|
| 2003/0034617 A1* | 2/2003 | Donoso et al. | 279/3 |
| 2004/0012776 A1* | 1/2004 | Bae | 356/237.4 |
| 2008/0051017 A1* | 2/2008 | Jiang et al. | 451/384 |
| 2008/0054885 A1* | 3/2008 | Dunklee | 279/3 |
| 2008/0245958 A1* | 10/2008 | Wolters et al. | 250/252.1 |

* cited by examiner

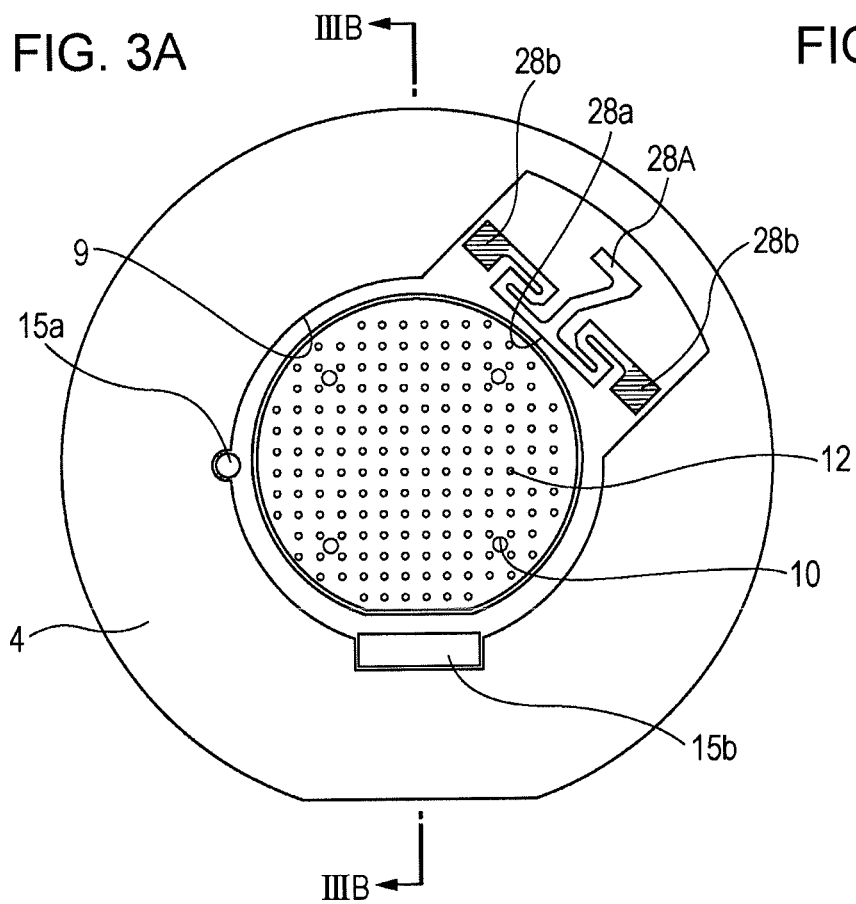
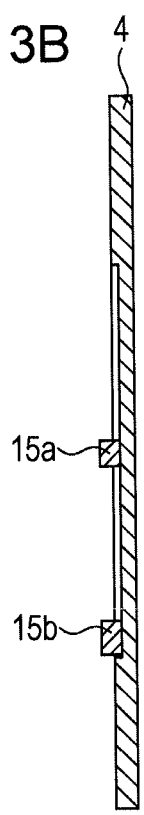
FIG. 3A
FIG. 3B
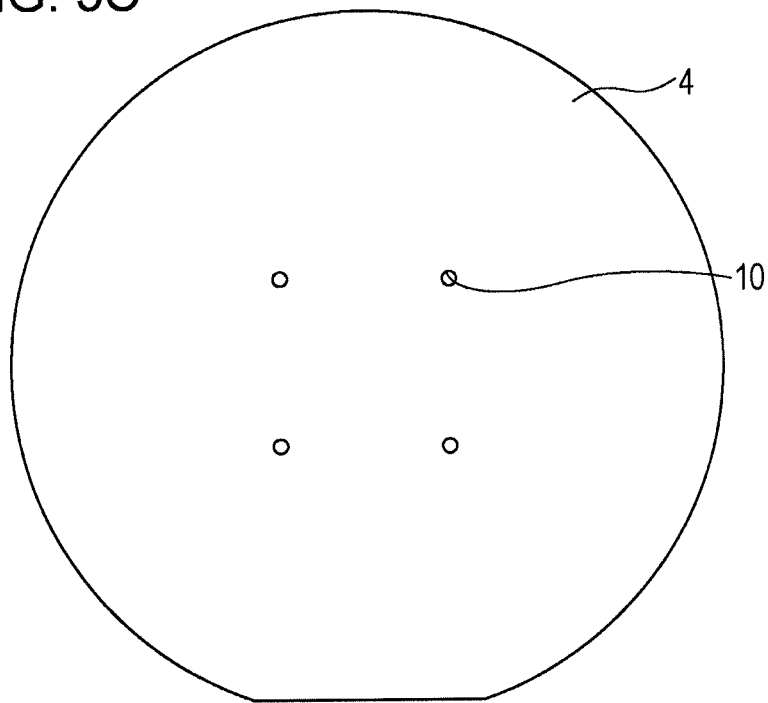
FIG. 3C

FIG. 6A
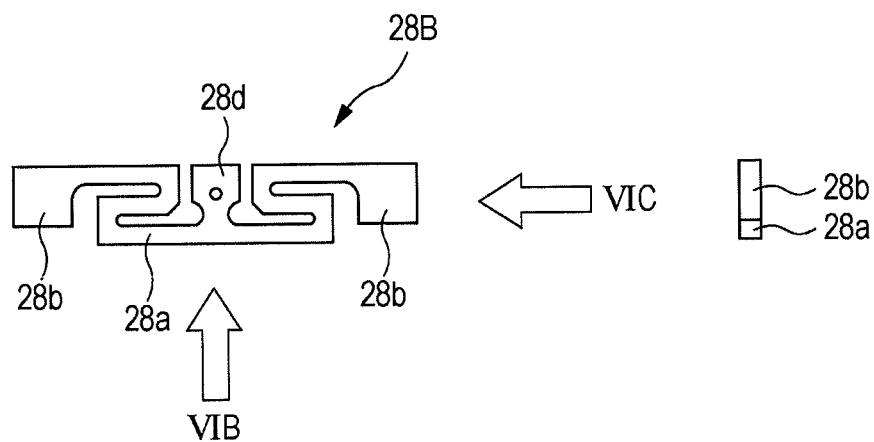
FIG. 6C
FIG. 6B
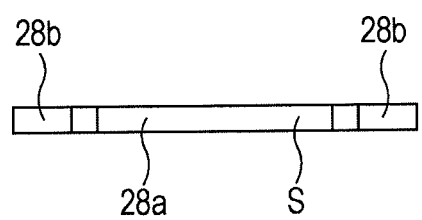

FIG. 10A
FIG. 10B
FIG. 10C
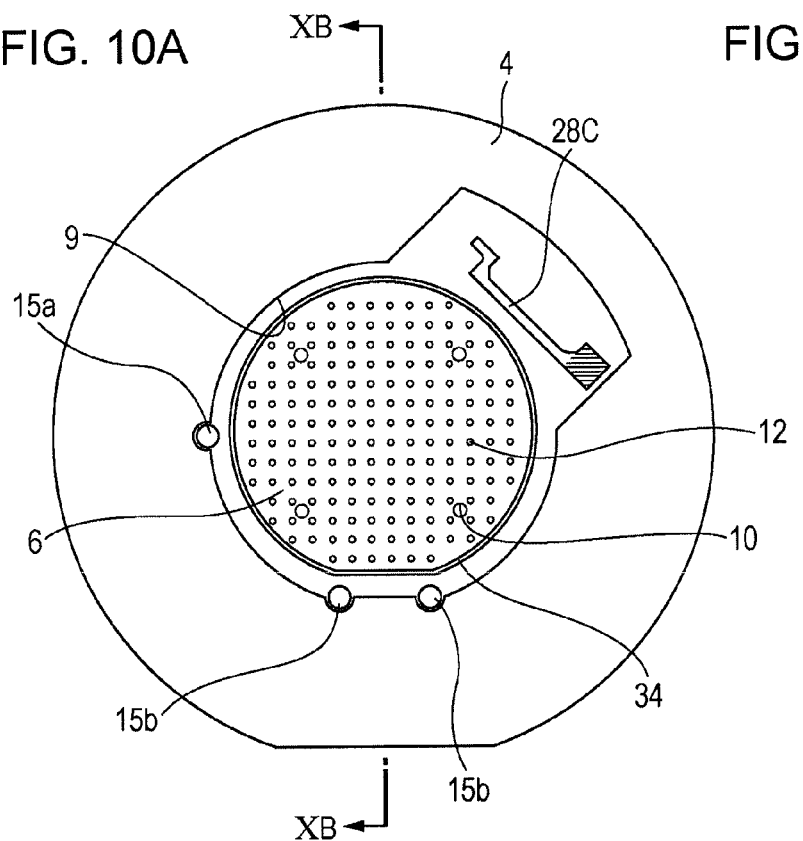
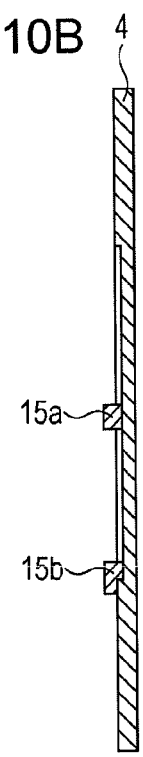
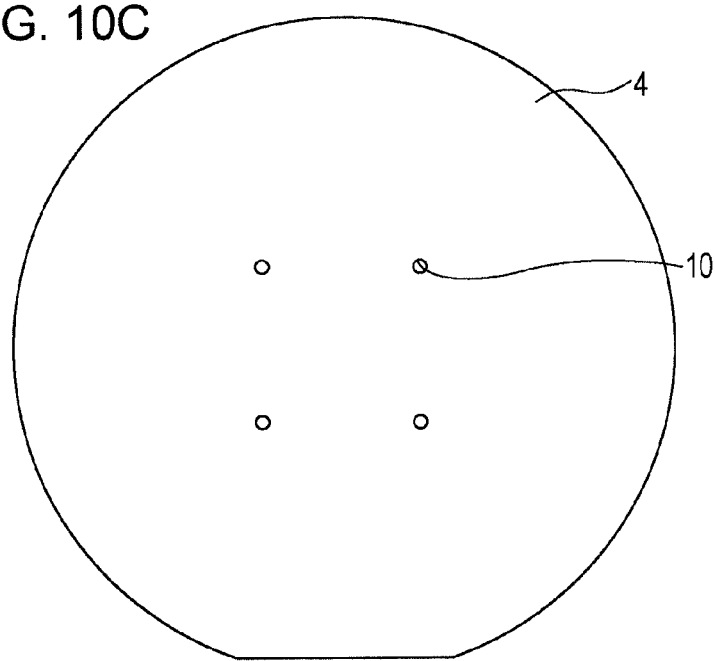

FIG. 16A
FIG. 16B
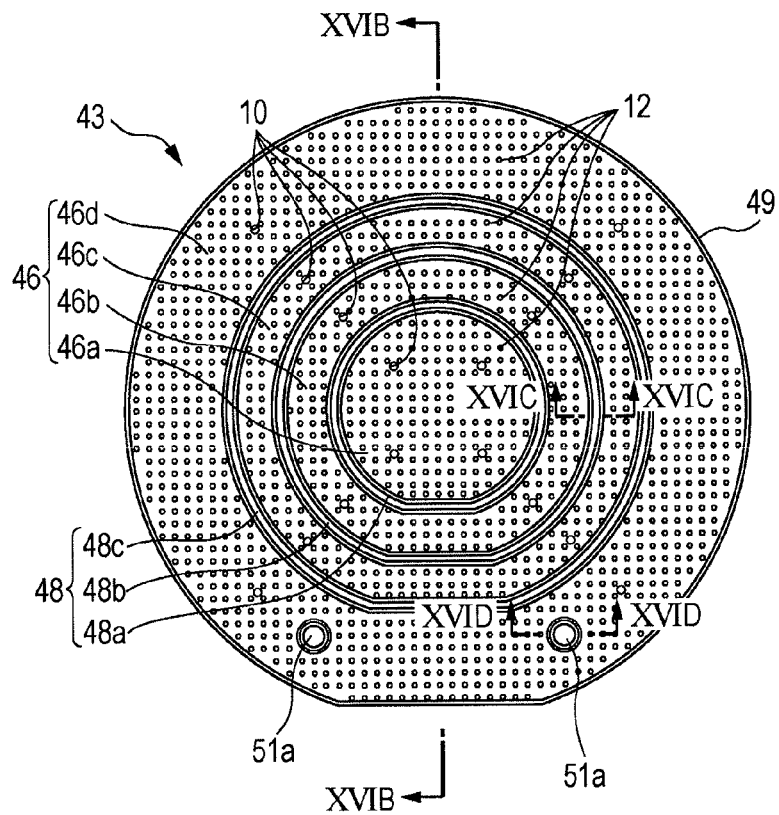
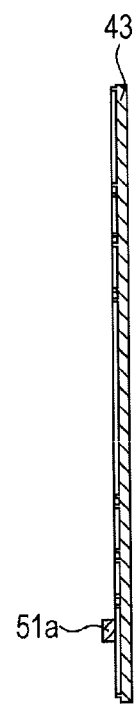
FIG. 16C
FIG. 16D
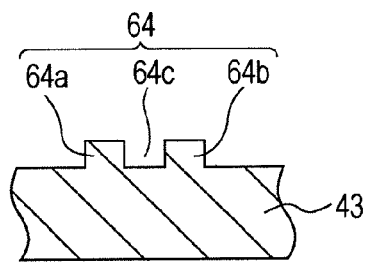
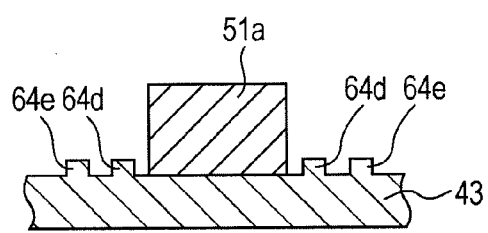

ATTRACTION MEMBER, AND ATTRACTION DEVICE AND CHARGED PARTICLE BEAM APPARATUS USING THE SAME

BACKGROUND OF THE INVENTION

1. Field of the Invention

The present invention relates to a chucking member, and a chucking device and a charged particle beam apparatus using the chucking member.

2. Description of the Related Art

In a manufacturing process of a semiconductor element, a sample (target) such as a semiconductor wafer made of silicon is sucked on and held on a chucking stage of a semiconductor manufacturing apparatus or a semiconductor inspection apparatus. Holding the target on the chucking stage is necessary for, for example, a step of polishing the target to obtain a mirror surface, a step of exposing part of a photosensitive member that is called resist and that is formed on the target with light or an electron beam, a step of removing the resist which has been exposed with the light or beam, and a step of inspecting the target. The chucking stage that holds the target is surrounded by gas such as the atmosphere, nitrogen, or oxygen. The pressure of the gas ranges from about $1\times10^5$ Pa, which is the atmospheric pressure, to about $1\times10^{-7}$ Pa, which is high vacuum. For example, Japanese Unexamined Patent Application Publication No. 9-283605 describes a configuration in which a chucking stage attracts and holds a target while a plurality of very small protrusions support the target.

Wiring of a semiconductor wafer is becoming finer and the area of the semiconductor wafer is becoming larger. In recent years, a large-size wafer with an outer diameter of 200 or 300 mm is mainly used.

Meanwhile, in recent years, a manufacturing apparatus similar to an apparatus for manufacturing a semiconductor element is employed for manufacturing an optical disc or a substrate for an LED by using a semiconductor laser. The material of the wafer for manufacturing the substrate is selected from, for example, compound semiconductors of GaN and InGaN, sapphire, and SiC. The wafer for such a purpose of use may occasionally have an outer diameter of about 100 mm that is smaller than the outer diameter of the semiconductor wafer.

Many manufacturing steps including, for example, an exposure step are common between the case in which the semiconductor element is manufactured and the case in which the optical disc or the substrate for the LED is manufactured. If the same semiconductor manufacturing apparatus can be used for the large semiconductor wafer and the relatively small wafer for the optical disc or the substrate for the LED, it is not necessary to introduce different semiconductor manufacturing apparatuses or to modify a semiconductor manufacturing apparatus to meet the purpose of use, and thus the manufacturing cost can be decreased. Owing to this, a chucking stage that can hold targets with different sizes is desired.

An chucking stage typically has a plurality of vacuum holes in accordance with the size of a target that is expected to be attracted (a region of the chucking stage with the vacuum holes is also called "vacuum hole formation region"). If a target having a size smaller than the expected size is mounted on the chucking stage, part of the vacuum holes is not covered with the target and is exposed. Then, when the target is attracted, outside air may be vacuumed through the exposed vacuum holes. In this case, it is difficult to stably attract and hold the target.

Therefore, it is desirable to stably hold the target having the size smaller than the vacuum hole formation region of the chucking stage.

SUMMARY

An chucking member according to a first aspect of the present invention is removably mounted on a chucking stage with a plurality of vacuum holes and holds a target to be sucked on the chucking stage. The chucking member comprises a substrate that is removably mounted on the chucking stage. The substrate comprises a vacuum region in which the target being to be arranged, the vacuum region allowing gas to be vacuumed through a part of the plurality of the vacuum holes, and an vacuum inhibition region provided around the vacuum region and covers the other of the plurality of vacuum holes.

An chucking device according to a second aspect of the present invention comprises an chucking stage comprising a plurality of vacuum holes; and the chucking member according to the first aspect of the present invention.

A charged particle beam apparatus according to a third aspect of the present invention comprises the chucking device according to the second aspect of the present invention; and a charged particle beam source operable to irradiate a target which to be mounted on the chucking device with a charged particle beam.

BRIEF DESCRIPTION OF THE DRAWING(S)

FIG. 3A is a plan view illustrating the chucking member according to the first embodiment of the present invention, FIG. 3B is a cross-sectional view taken along line IIIB-IIIB in FIG. 3A, and FIG. 3C is a rear view of FIG. 3A;

FIG. 6A is a plan view illustrating still another configuration example of the holding member, FIG. 6B is a lower side view in a direction indicated by arrow VIB, and FIG. 6C is a right side view in a direction indicated by arrow VIC;

FIG. 10A is a plan view illustrating another configuration example of the chucking member according to the first embodiment of the present invention, FIG. 10B is a cross-sectional view taken along line XB-XB in FIG. 10A, and FIG. 10C is a rear view of FIG. 10A;

Figure 17A:
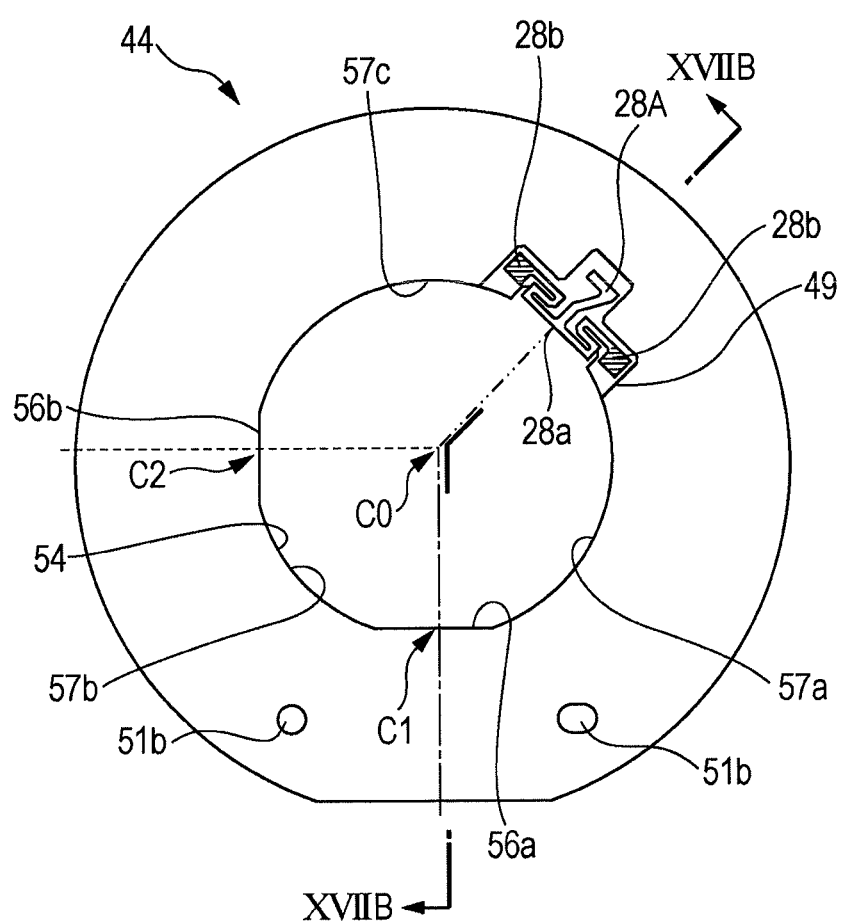
Figure 17B:
Figure 18:
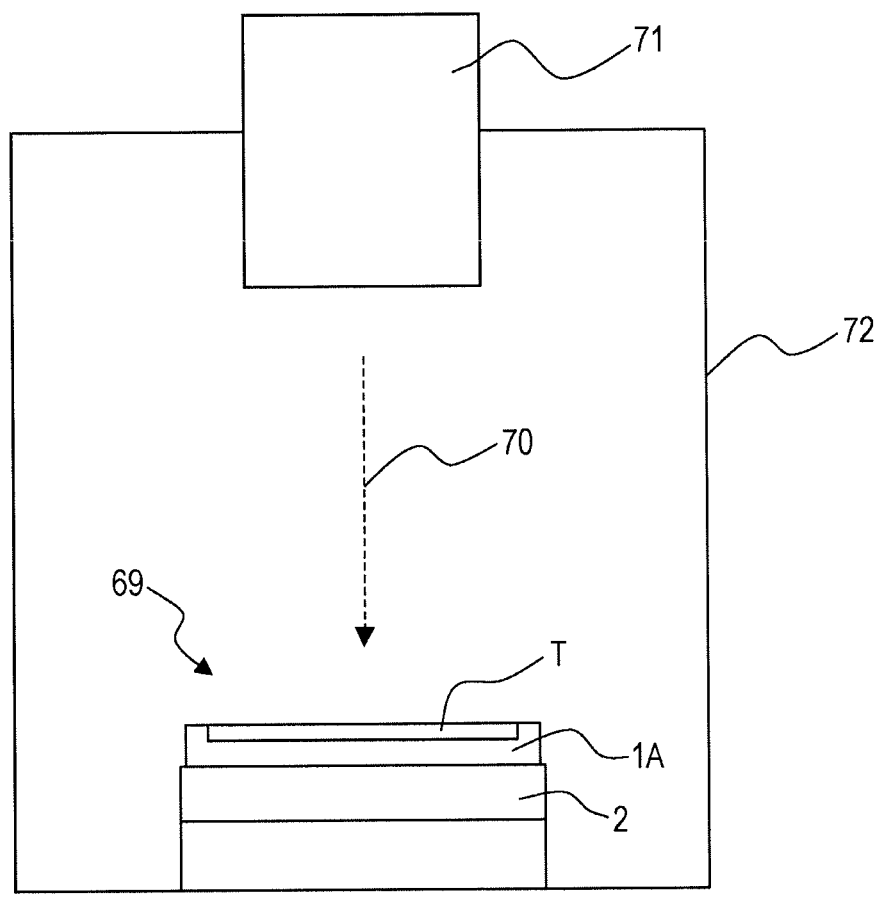
Figure 19:
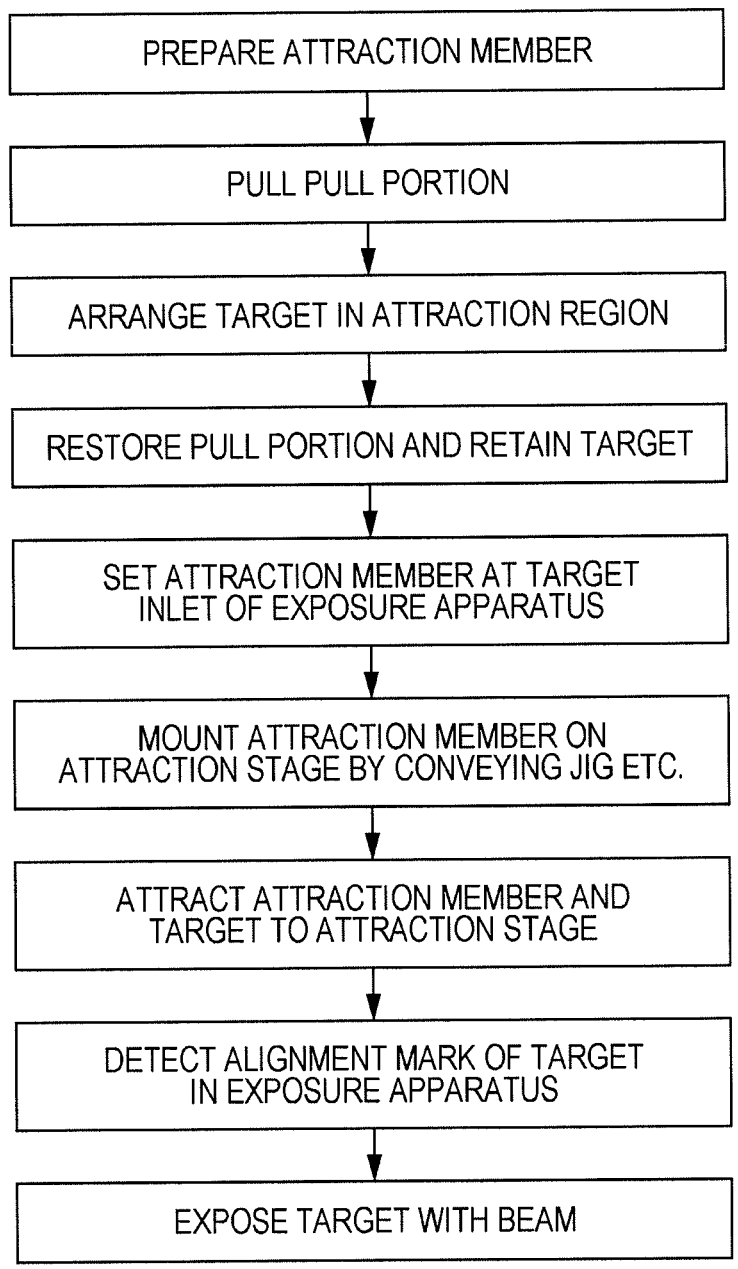
Figure 20:
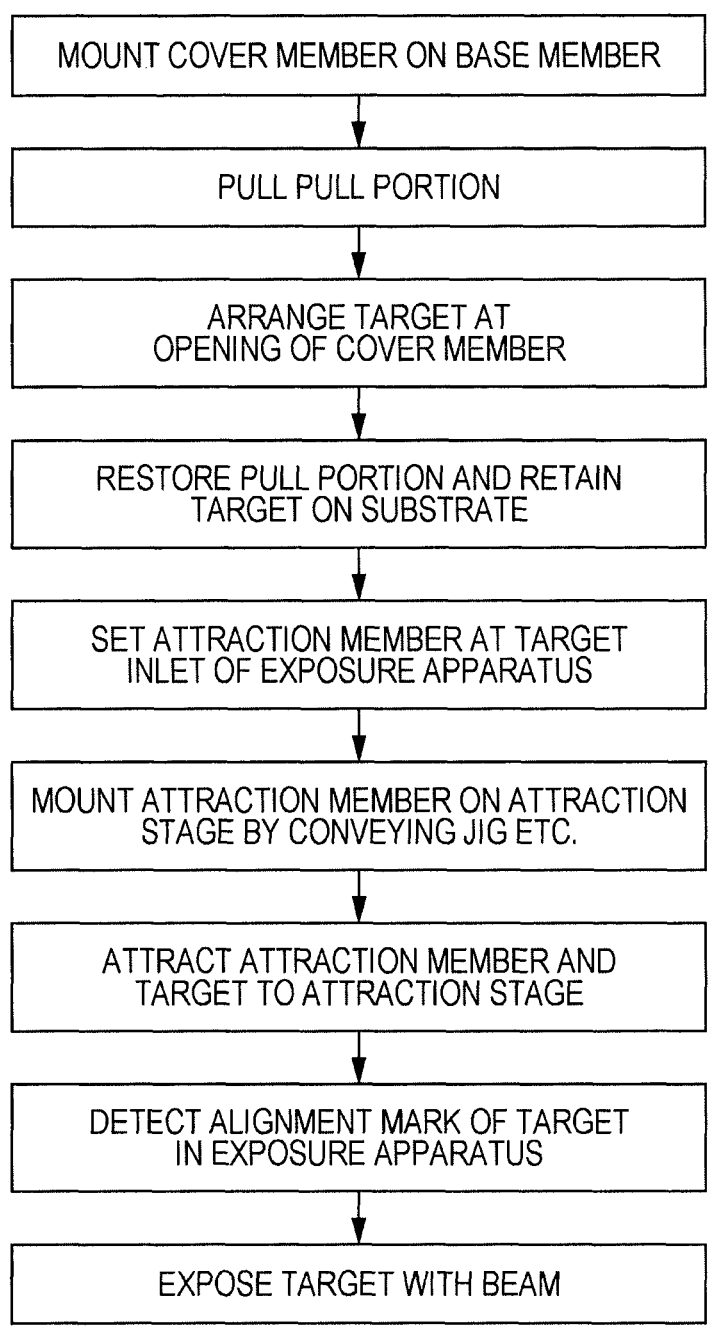

FIG. 16A is a plan view illustrating a substrate included in the chucking member according to the third embodiment of the present invention, FIG. 16B is a cross-sectional view taken along line XVIB-XVIB in FIG. 16A, FIG. 16C is a partly enlarged cross-sectional view taken along line XVIC-XVIC in FIG. 16A, and FIG. 16D is a partly enlarged cross-sectional view taken along line XVID-XVID in FIG. 16A;

FIG. 17A is a plan view illustrating a cover member included in the chucking member according to the third embodiment of the present invention, and FIG. 17B is a cross-sectional view taken along line XVIIB-XVIIB in FIG. 17A;

FIG. 18 schematically illustrates a configuration of a light irradiation apparatus and a charged particle beam apparatus according to an embodiment of the present invention;

FIG. 19 is a flowchart illustrating an example method for exposing a target with light or a beam by using the chucking member according to the first embodiment of the present invention; and FIG. 20 is a flowchart illustrating an example method for exposing a target with light or a beam by using the chucking member according to the second embodiment of the present invention.

DETAILED DESCRIPTION OF THE PREFERRED EMBODIMENT(S)

Embodiments of the present invention is described in detail below.

First Embodiment

An chucking member 1A is used when a target T such as a semiconductor wafer is attracted. The target T is held on an chucking stage 2. The chucking member 1A includes a substrate 4 that is removably mounted on the chucking stage 2. The substrate 4 has a vacuum region 6. The target T is arranged in the vacuum region 6.

The chucking stage 2 has a plurality of vacuum holes 2a for vacuuming gas. The vacuum holes 2a are provided in accordance with the size of a target that is expected to be sucked on the chucking stage 2 without the chucking member 1A. The region of the chucking stage 2 provided with the plurality of vacuum holes 2a is also called "vacuum hole formation region."

Also, the substrate 4 has a vacuum inhibition region 8 provided around the vacuum region 6. The vacuum inhibition region 8 covers part of the plurality of vacuum holes 2a, or part of the vacuum hole formation region. The vacuum inhibition region 8 inhibits the gas from being vacuumed through the vacuum holes 2a.

The substrate 4 includes a portion with a recessed surface (hereinafter, also referred to as "first portion") 9 and the other portion (hereinafter, also referred to as "second portion"). The first portion 9 includes a circular portion at the center, and a portion, in which a holding member 28 (described later) is arranged. The vacuum region 6 is provided in the first portion 9. The vacuum inhibition region 8 extends from the first portion 9 to the second portion.

Figure 1A:
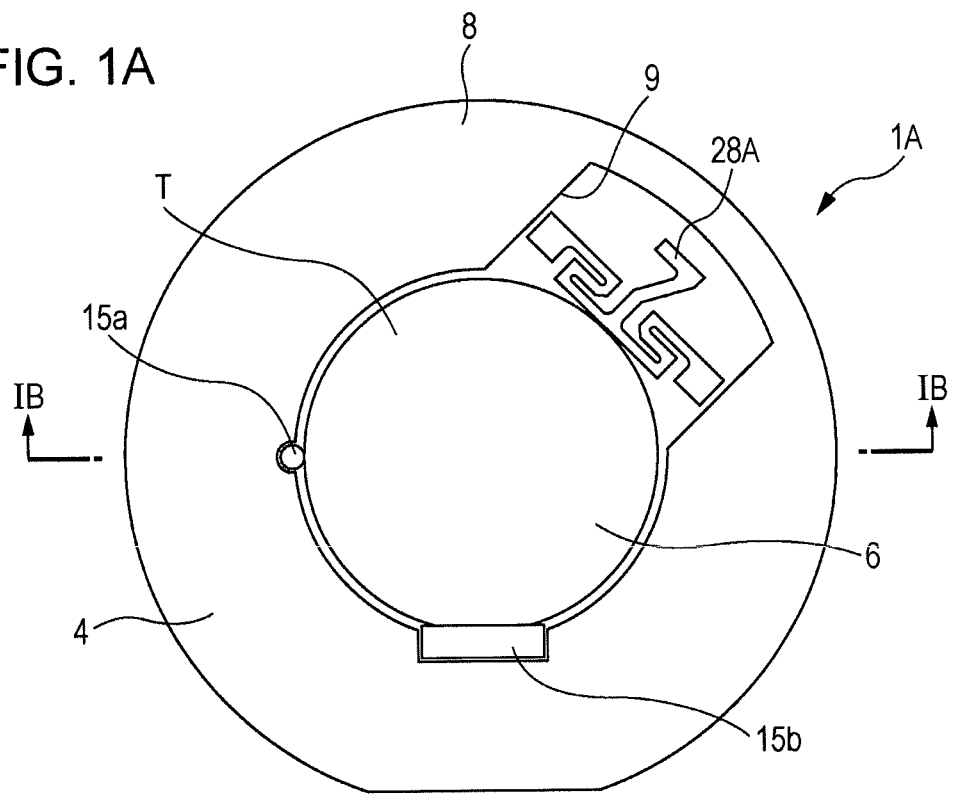
FIG. 1A is a plan view illustrating an chucking member according to a first embodiment of the present invention when the chucking member is mounted on an chucking stage and a target is sucked on the chucking member.
Figure 1B:
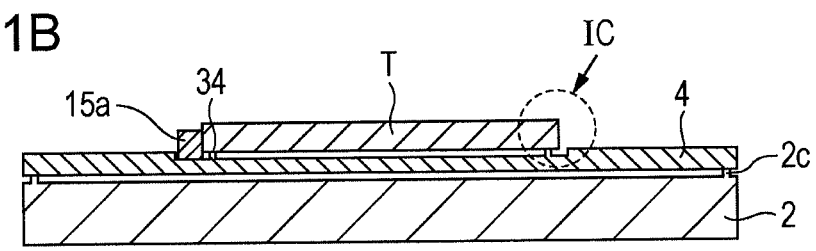
FIG. 1B is a cross-sectional view taken along line IB-IB in FIG. 1A.
Figure 1C:
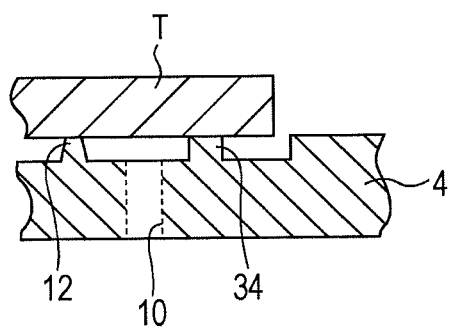
FIG. 1C is a partly enlarged view of an area IC surrounded by a broken line in FIG. 1B.
Figure 2:
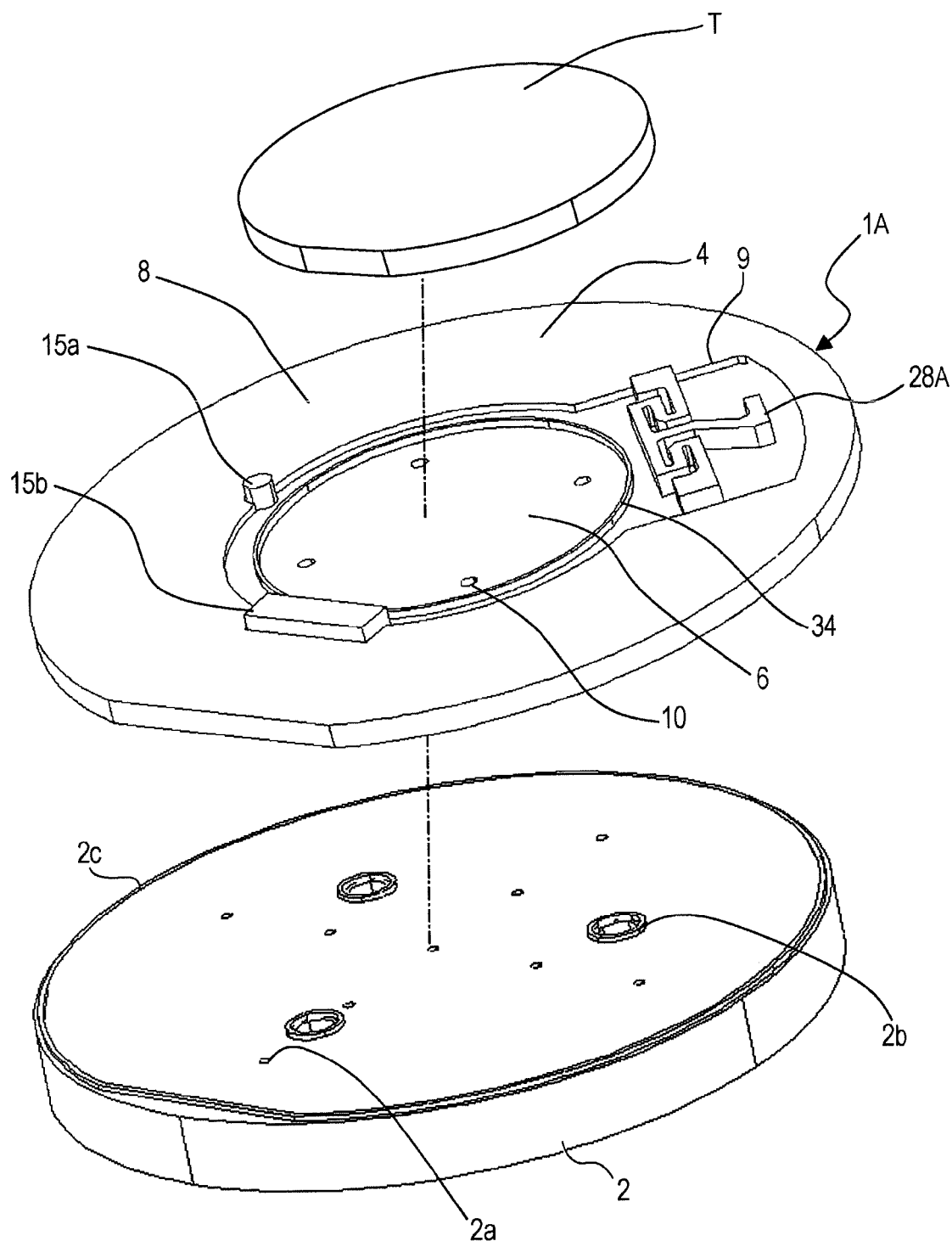
FIG. 2 is a perspective view illustrating the chucking stage, the target, and the chucking member according to the first embodiment of the present invention, which are separated from one another.

Referring to FIGS. 1C and 2, the substrate 4 has a sucking hole 10 in the vacuum region 6. The target T is sucked on the chucking stage 2 through the vacuum region 6 by a suction force that is generated when the gas is vacuumed through the sucking hole 10.

If the gas is vacuumed through the sucking hole 10 of the substrate 4, the chucking member 1A and the target T can be simultaneously attracted while the target T is located in the vacuum region 6.

The vacuum region 6 has a plurality of protrusions 12. The plurality of protrusions 12 have equivalent heights. The protrusions 12 have a height equivalent to a height of a surface of the other portion (the second portion) of the substrate 4 whose surface is not recessed. The target T is attracted in a state in which the target T contacts tops of the protrusions 12. The height of the protrusions 12 is the same or substantially the same as the height of an annular seal portion 34 (described later). Hence, the target T is attracted while the target T is in contact with the protrusions 12 and the annular seal portion 34.

In addition, the substrate 4 includes a contact part 15 arranged at the vacuum inhibition region 8. The target T contacts the contact part 15 when the target T is arranged in the vacuum region 6. More specifically, the contact part 15 is a protruding member protruding upward from the surface of the substrate 4.

The contact part 15 including the protruding member is provided outside the vacuum region 6. The contact part 15 contacts a side surface of the target T when the target T is arranged in the vacuum region 6. The number of contact portions 15 and the shape of each contact part 15 are not particularly limited. The contact portion of the chucking member 1A according to this embodiment includes a contact part 15a that is a columnar protruding member and a contact part 15b that is a rectangular protruding member (contact plate) (hereinafter, the contact portions 15a and 15b are respectively called "contact part 15" unless the portions are particularly distinguished). Since the contact part 15b is rectangular and a flat side surface of the contact part 15b contacts the target T, the target T can be precisely and stably retained on the substrate 4. The contact part 15 is preferably fixed to the chucking member 1A, and more preferably formed integrally with the chucking member 1A.

The chucking member 1A includes an annular seal portion 34 in the first portion 9 and the vacuum inhibition region 8, at a position around the vacuum region 6. The annular seal portion 34 is an annular wall. The annular seal portion 34 preferably has a height equivalent to the height of the protrusions 12 provided in the vacuum region 6. Referring to FIG. 1C, the annular seal portion 34 supports the target T together with the protrusions 12. The annular seal portion 34 contacts an outer circumferential portion of one surface (or a surface facing the substrate 4) of the target T. Thus, a space surrounded by the one surface of the target T, a surface (or a surface facing the target T) of the vacuum region 6, and the annular seal portion 34 can be an enclosed space. Gas in the space is exhausted (vacuumed) through the sucking hole 10, so that a sucking force is generated. The sucking force can be transmitted to the target T. In the cross section taken along line IB-IB in FIG. 1A, the sucking hole 10 is not actually visible; however, to illustrate the presence of the sucking hole 10 inside the annular seal portion 34 in a perspective plan view of the chucking member 1A, FIG. 1C illustrates the sucking hole 10 by a dotted line for the convenience.

The chucking member 1A also includes a holding member 28 that presses the target T against the contact part 15 and holds the target T between the holding member 28 and the contact part 15. The holding member 28 is provided in the recessed first portion 9 such that the holding member 28 is fitted into the recessed first portion 9. The configuration of the holding member 28 is described in detail below. The holding member 28 presses the target T against the contact part 15, and retains the target T in the vacuum region 6. With the holding member 28 and the contact part 15, the target T can be relatively easily retained. Thus, even if a target T is repeatedly mounted on and removed from the substrate 4, such work is not troublesome.

The holding member 28 is preferably made of a material having a lower hardness than the target T. The hardness may be, for example, Vickers hardness. Vickers hardness is measured on the basis of JIS (Japanese Industrial Standards Committee) Z 2244, 2009.

The holding member 28 may be made of a semiconductor material, resin, or zirconium oxide ceramic. When the material of the holding member 28 is a semiconductor material, the holding member 28 can dissipate static electricity. This is advantageous particularly when the holding member 28 is expected to be conveyed into an exposure apparatus. When the material of the holding member 28 is resin or zirconium oxide ceramic, in a case in which the target T is a silicon wafer, even if the holding member 28 contacts the target T and hence wears, the wearing dust is not metal. The wearing dust does not adversely affect the target T. In particular, zirconium oxide ceramic hardly wears. The wearing matter does not adhere to the target T. Further, the holding member 28 is preferably made of a material with a high thermal conductivity.

In the case in which the target T is a silicon wafer, for example, the material that satisfies the above condition may be polycarbonate resin.

Figure 4A:
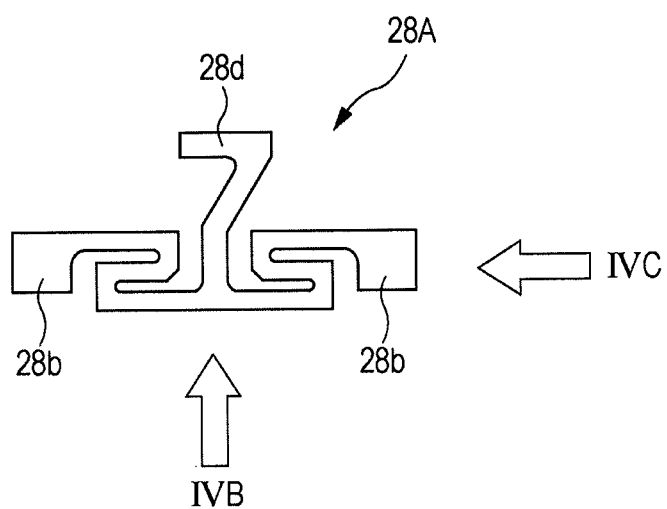
FIG. 4A is a plan view illustrating a holding member that is included in the chucking member according to the first embodiment of the present invention and attached to the chucking member.
Figure 4C:
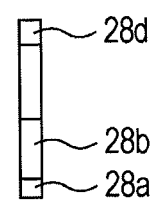
FIG. 4C is a side view (right side view) in a direction indicated by arrow IVC in FIG. 4A.
Figure 4B:
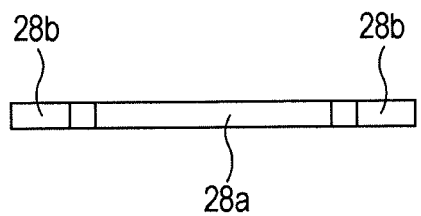
FIG. 4B is a side view (lower side view) in a direction indicated by arrow IVB in FIG. 4A.
Figure 5A:
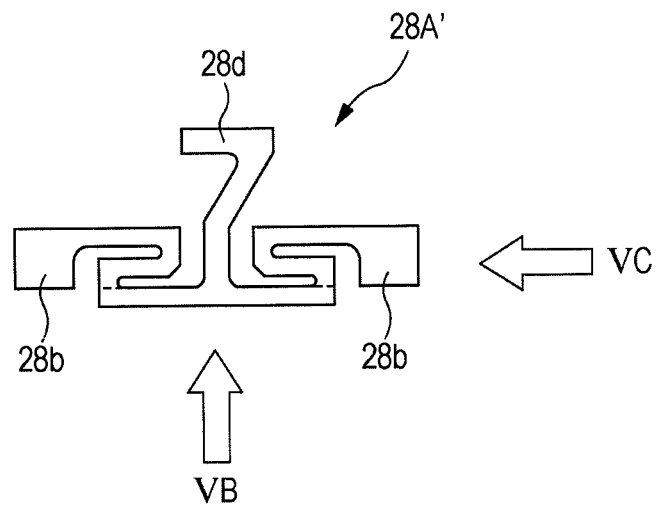
FIG. 5A is a plan view illustrating another configuration example of the holding member.
Figure 5C:
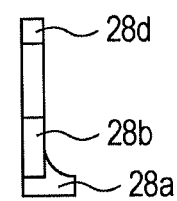
FIG. 5C is a right side view in a direction indicated by arrow VC.
Figure 5B:
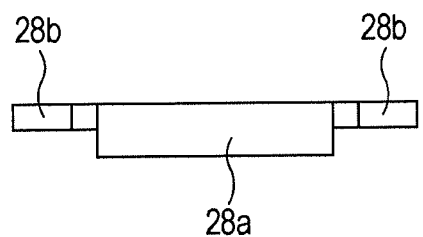
FIG. 5B is a lower side view in a direction indicated by arrow VB.

The holding member 28 may have any of various shapes. Exemplary shapes are described below. Each of holding members 28A, 28A', 28B, and 28B' illustrated in FIGS. 4A to 4C, 5A to 5C, 6A to 6C, 7A and 7B, and 9 (if the holding members 28A, 28A', 28B, and 28B' are not distinguished, the members are merely respectively referred to as the "holding member 28") includes a contact portion 28a that contacts the target T, a plurality of fixed portions 28b located at both sides of the contact portion 28a in a direction (X direction) perpendicular to a pressing direction (Y direction), and a plurality of extendable portions 28c that connect the contact portion 28a with the extendable portions 28c and expand and contract in the pressing direction. The holding member 28A' illustrated in FIGS. 5A to 5C represents a case in which the contact portion 28a of the holding member 28A' has a larger area in a lower side view (FIG. 5B) than the contact portion 28a of the holding member 28A illustrated in FIGS. 4A to 4C so that the target T reliably contacts the contact portion 28a.

The configuration of the holding member 28B is described below with reference to FIGS. 7A and 7B. The holding member 28B is described; however, this description may be applied to the holding member 28A and 28A' illustrated in FIGS. 4A to 4C, and 5A to 5C.

Figure 7A:
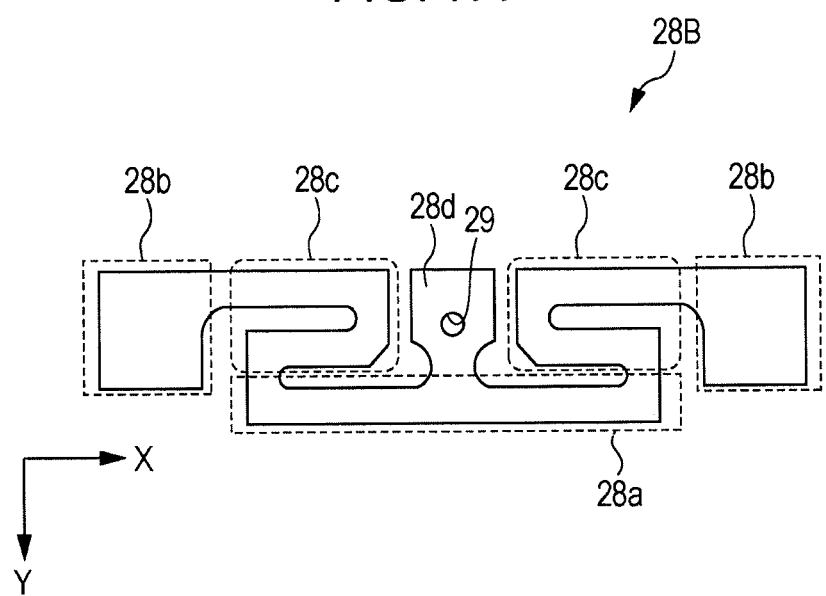
FIGS. 7A and 7B are plan views for explaining a detailed configuration of the holding member.
Figure 7B:
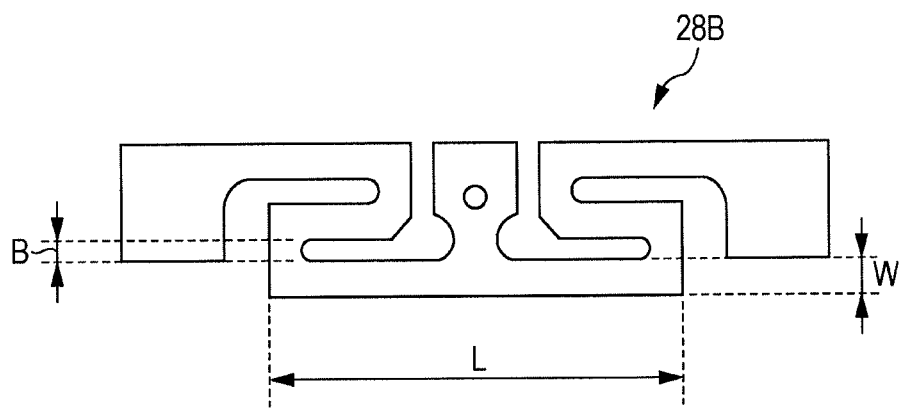

Referring to FIGS. 7A and 7B, the holding member 28B includes the rectangular contact portion 28a whose longitudinal direction extends in the X direction. The contact portion 28a is located equidistant from the two fixed portions 28b. The extendable portions 28c connect ends of the contact portions 28a in the longitudinal direction with the fixed portions 28b. The extendable portions 28c have bent portions between the fixed portions 28b and the contact portion 28a. The extendable portions 28c expand and contract in the pressing direction (Y direction). More specifically, each extendable portion 28c extends from an end (hereinafter, also referred to as "first end") that is connected with the fixed portion 28b, in the direction (X direction) perpendicular to the pressing direction, is bent in a U-shape, and extends in the X direction again. Assuming that the bent part is a U-shaped portion, the U-shaped portion has an end (hereinafter, also referred to as "second end") which is different from the end connected with the fixed portion 28b and is connected with the end of the contact portion 28a through a portion (hereinafter, referred to as "connect portion") extending in the Y direction. Accordingly, the extendable portion 28c acts like a spring that expands and contracts in the Y direction. In the following description, the portion extending in the X direction from the first end to the bent portion is called "first extending portion," and the portion extending from the bent portion to the second end is called "second extending portion."

The fixed portions 28b are fixed to the substrate 4, and, more particularly, to an inner wall of the recessed first portion 9. The contact portion 28a can move in the pressing direction.

The holding member 28B includes a pull portion 28d that is connected with the contact portion 28a to move the contact portion 28a in the Y direction. The pull portion 28d is connected with the contact portion 28a in an area between the two fixed portions 28b in the X direction. Regarding the holding member 28A or 28A' illustrated in FIGS. 4A to 4C or FIGS. 5A to 5C, the pull portion 28d is located outside the fixed portions 28b in the Y direction. In this case, the pull portion 28d can be easily pulled in the Y direction. In contrast, the pull portion 28d of the holding member 28B is located at the same position as the position of the fixed portions 28b or inside the fixed portions 28b in the Y direction. The pull portion 28d does not protrude from the fixed portions 28b. In this case, the holding member 28 can be downsized. When the pull portion 28d is located outside the fixed portions 28b in the Y direction, the outer edge of the pull portion 28d is outside the outer edges of the fixed portions 28b in the Y direction. When the pull portion 28d is located inside the fixed portions 28b in the Y direction, the outer edge of the pull portion 28d is inside the outer edges of the fixed portions 28b in the Y direction.

The pull portion 28d of the holding member 28B has a hole 29. For example, a tip of a pin-like hook member is inserted into the hole 29, and the pull portion 28d is pulled in the Y direction. Thus, the contact portion 28a can be displaced outward in the Y direction such that the contact portion 28a is moved away from the vacuum region 6. Also, the force exerted on the pull portion 28d is decreased or eliminated, and hence the pull portion 28d and the contact portion 28a are displaced inward in the Y direction such that the pull portion 28d and the contact portion 28a are moved toward the vacuum region 6. The pull portion 28d may be preferably located between the contact portion 28a and the fixed portions 28b in the Y direction. In this case, the holding member 28 can be further downsized. Regarding the holding member 28A, since the pull portion 28d is located outside the fixed portions 28b in the Y direction, the pull portion 28d may be modified, for example, by bending a tip end of the pull portion 28b, to allow the hook member to be easily hooked to the pull portion 28d. Hence, the hole 29 does not have to be provided.

Next, the action of the holding member 28 is described. First, a force is exerted on the pull portion 28d, and hence the pull portion 28d is displaced outward in the Y direction such that the pull portion 28d is moved away from the vacuum region 6. Thus, the target T is positioned in the vacuum region. Then, the force exerted on the pull portion 28d is decreased or eliminated, and hence the pull portion 28d and the contact portion 28a are displaced inward in the Y direction such that the pull portion 28d and the contact portion 28a are moved toward the vacuum region 6. Thus, the target T is pressed to the contact portions 15a and 15b by using the restoring force of the extendable portions 28c toward the original positions. That is, the holding member 28 acts like a spring that extends and contracts in the Y direction. The holding member 28 preferably has a hinge-like shape that is displaceable in the X direction.

The center of the hole 29 is preferably located at the substantially same position as an outer edge of the second extending portion near the first extending portion or at a position closer to the contact portion 28a than the outer edge of the second extending portion near the first extending portion. Since the hole 29 is located at that position, when the tip of the hook member is inserted into the hole 29 and pulls the contact portion 28a outward in the Y direction, it can be effectively suppressed that the contact portion 28a is lifted up, i.e., and the contact portion 28a is moved in a direction (Z direction) perpendicular to the X and Y directions. More preferably, the hole 29 may be provided in the contact portion 28a, or in the pull portion 28d at a position further closer to the contact portion 28a in the Y direction. Since the hole 29 is located at that position, when the tip of the hook member is inserted into the hole 29 and pulls the contact portion 28a outward in the Y direction, it can be further effectively suppressed that the contact portion 28a is lifted up. Since the contact portion 28a contacts the target T, the width (the length in the Y direction) of the contact portion 28a may be smaller in view of rigidity. In this case, it is difficult to make the hole 29 in the contact portion 28a. The hole 29 may be made in the pull portion 28d. The width of the pull portion 28d occasionally has to be smaller in the X direction at a portion close to the contact portion 28a in view of the rigidity. In this case, the hole 29 may be made in a portion of the pull portion 28d such that the portion does not affect the operation of the holding member 28.

Further, referring to FIG. 7B, when L is a length in the X direction and W is a width in the Y direction of the contact portion 28a of the holding member 28B, for example, W/L is preferably in a range from 0.05 to 0.07. If the relationship is satisfied, when the force is exerted on the pull portion 28d in the Y direction, the contact portion 28a is easily displaced in the Y direction by following the pull portion 28d.

If W/L is too small, a pressing force that is applied to the target T by the contact portion 28a becomes small, and it is difficult to precisely hold the target T. If W/L is too large, the pressing force that is applied to the target T by the contact portion 28a becomes large, resulting in that the target T may be deformed or broken. Hence, W/L is preferably in the range from 0.05 to 0.07.

Also, when B is a width in the Y direction of the connect portion of each extendable portion 28c, W/B is preferably in a range from 0.5 to 2. If W/B is too small, the displacement of the contact portion 28a becomes small, and the pressing force that is applied to the target T by the contact portion 28a becomes small. It is difficult to precisely hold the target T. If W/B is too large, the extendable portion 28c becomes excessively deformed, the extendable portion 28c is deviated in a direction other than the Y direction. It is difficult to apply the pressing force to the target T in the Y direction. As the result, it is difficult to precisely hold the target T. Hence, W/B is preferably in the range from 0.5 to 2.

The contact portion 28a has a contact surface S that contacts the target T. Referring to FIG. 6B, the contact surface S is a surface extending in the Y direction when the contact portion 28a is viewed from below. The contact surface S contacts the target T and extends perpendicularly to the pressing direction (Y direction), for example, as illustrated in FIG. 6A.

Figure 8A:
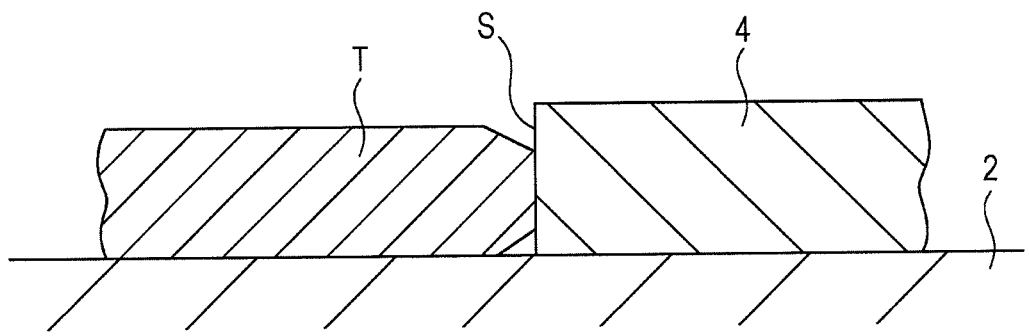
FIGS. 8A and 8B are cross-sectional views each illustrating a positional relationship between an end of a target and a contact surface of the holding member against the target.
Figure 8B:
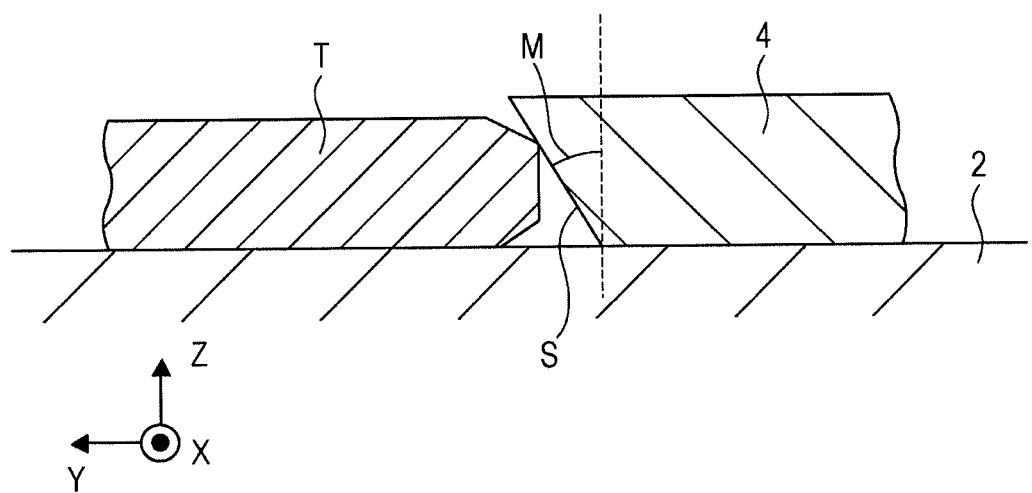

The contact surface S may be inclined with respect to the direction (Z direction) perpendicular to both the pressing direction (Y direction) and the direction (X direction) perpendicular to the pressing direction. For example, the contact surface S illustrated in FIG. 8B is inclined toward the target T. Since the contact surface S is inclined as described above, the contact surface S covers an end portion of the target T. Thus, it can be suppressed that the target T is separated and lifted up from the chucking stage 2. Hence, the target T can be precisely positioned. Also, it can be suppressed that the target T is removed from the substrate 4. If the inclination of the contact surface S is too large, the pressing force in the Y direction is not efficiently transmitted from the contact surface S to the target T. Hence, the inclination M (defined by an angle between the contact surface S and an imaginary line perpendicular to the surface of the substrate 4 facing with the chucking stage 2) is preferably larger than 0 degree and equal to or smaller than 30 degrees.

Figure 9:
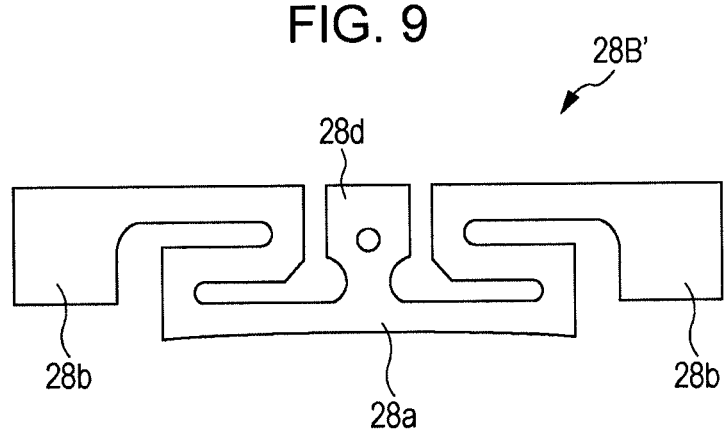
FIG. 9 is a plan view illustrating yet another configuration example of the holding member.

Alternatively, the contact surface S may be curved along the outer circumference of the target T, like the holding member 28B' illustrated in FIG. 9. The curved contact surface S can press the target T by the entire of the contact surface S, and hence the contact surface S can precisely and reliably hold the target T.

With the configuration using the holding member 28 and the contact part 15, even if the dimension in the radial direction of the target T varies, the target T can be stably held by the holding member 28 and the contact part 15, and it can be suppressed that the target T is rotated in the vacuum region 6. With this configuration, the target T can be positioned in the vacuum region 6 with a high positioning precision.

Also, with the holding member 28, the target T can be held or released merely by moving the contact portion 28a of the holding member 28 in the Y direction. The target T can be relatively easily mounted.

The holding member 28C illustrated in FIG. 10A is a leaf spring. One end of the holding member 28C is fixed to the substrate 4, and, more particularly, to the inner wall of the recessed first portion 9, and the other end of the holding member 28C is not fixed. With this configuration, the other end is displaceable. When the target T is arranged and retained in the vacuum region 6, the other end can be moved closer to and brought into contact with the target T. When the target T is removed from the substrate 4, the other end can be moved away from the target T. Although the operation of the holding member 28C is slightly different from those of the holding members 28A, 28A', 28B, and 28B', the holding member 28C can attain an advantage similar to those of the holding members 28A, 28A', 28B, and 28B', in that the target T is relatively easily mounted because the target T can be held or removed merely by moving the end of the holding member 28C. However, the holding members 28A, 28A', 28B, and 28B' are more advantageous than the holding member 28C because it can be more effectively suppressed that the target T is rotated.

With the chucking member 1A according to this embodiment, when the target T is arranged in the vacuum region 6, the target T can be stably attracted and held. The vacuum region 6 has a smaller size than the vacuum hole formation region of the chucking stage 2. Therefore, with the chucking member 1A, a target T with a smaller size than the size of the vacuum hole formation region of the chucking stage 2 can be stably sucked and held. Also, the chucking member 1A may be removed, and another target T may be arranged to cover all vacuum holes 2a in the chucking stage 2, so that the target T is sucked and held. Thus, with the chucking member 1A according to this embodiment, targets T with different sizes can be stably sucked and held.

Also, with the chucking member 1A according to this embodiment, targets T with different sizes can be sucked on the chucking stage 2 with high positioning precisions. Further, with the chucking member 1A, a target T with a size smaller than the size of the chucking stage 2 can be easily mounted or removed merely by attracting the chucking member 1A to the chucking stage 2.

The chucking member 1A and the chucking stage 2 for mounting the chucking member 1A define an chucking device. The chucking device may further include a vacuum pump (not illustrated) to decrease the pressure in the vacuum holes 2a of the chucking stage 2.

Regarding the chucking member 1A according to this embodiment, since the target T has a circular shape, the vacuum region 6 has a circular shape. Referring to FIG. 2, if the target T is a silicon wafer, the silicon wafer may have an orientation flat that indicates the orientation of the silicon wafer. In this case, the vacuum region 6 may have a line portion corresponding to the orientation flat.

A through hole 2b in the chucking stage 2 is a hole from which an ejector pin protrudes when the substrate 4 or the target T is mounted. For example, the substrate 4 is mounted on the chucking stage 2, the substrate 4 is temporarily mounted on the ejector pin protruding from the through hole 2b. Then, the ejector pin is automatically lowered or controlled to be lowered, and is retracted into the through hole 2b. Accordingly, the substrate 4 is mounted on the chucking stage 2.

The chucking stage 2 is normally installed in a semiconductor apparatus. When the substrate 4 etc. is mounted on the chucking stage 2, the substrate 4 is conveyed to the chucking stage 2 by a conveying jig such as an automatically moved arm. It is difficult to directly mount the substrate 4 on the chucking stage 2 by the arm with no damage. Thus, the substrate 4 is mounted on the chucking stage 2 such that the substrate 4 is temporarily mounted on the ejector pin, and the ejector pin is retracted.

An annular wall 2c is provided on an outer circumferential portion of the chucking stage 2. The annular wall 2c suppresses the leaking of gas when the substrate 4 is mounted on the chucking stage 2 for the vacuum. In this embodiment, an enclosed space surrounded by the annular wall 2c, the chucking stage 2, and a surface (or a surface facing the chucking stage 2) of the substrate 4 can be formed. Gas present in the space is vacuumed through the vacuum holes 2a in the chucking stage 2. Thus, the substrate 4 and the target T can be sucked on the chucking stage 2.

The material of the substrate 4 for the chucking member according to this embodiment is preferably ceramic, and, more preferably, an alumina sintered compact or a silicon carbide sintered compact.

The alumina sintered compact can recognize a substrate 4 with high rigidity, high strength, and high hardness. The substrate 4 having a Young's modulus in a range from 280 to 400 GPa, a three-point flexural strength in a range from 250 to 500 MPa, and a Vickers hardness (Hv1) in a range from 12 to 18 GPa can be obtained. Thus, the substrate 4 is less distorted and hardly damaged.

Even if the substrate 4 is made of a silicon carbide sintered compact, the substrate 4 can have high rigidity and high strength like the substrate 4 made of an alumina sintered compact. In addition, the substrate 4 made of a silicon carbide sintered compact can have high hardness and high thermal conductivity. The substrate 4 is less distorted and hardly damaged. In addition, the substrate 4 has high heat radiation performance, and hence distortion and deformation can be further reduced. The substrate 4 having Young's modulus in a range from 350 to 500 GPa, a three-point flexural strength in a range from 450 to 600 MPa, a Vickers hardness (Hv1) in a range from 20 to 23 GPa, and a thermal conductivity in a range from 60 to 200 W/(m·K) can be obtained.

In particular, if the substrate 4 is made of a silicon carbide sintered compact and has a thermal conductivity of 180 W/(m·K) at room temperatures, even when heat is locally applied to the target T, the heat can be efficiently radiated. The target T is hardly distorted due to thermal expansion. The precision can be prevented from being degraded due to generation of heat during exposure in a semiconductor manufacturing process.

Next, a manufacturing method of the substrate 4 made of ceramic will be described.

(1) Molding and Sintering Ceramic Base Powder

When the substrate 4 is made of alumina, a desirable sintering additive is added to alumina powder, which is a principal component. The alumina powder and the sintering additive are mixed by wet mixing, and then dried by spray drying. Thus, alumina base powder is obtained. The alumina base powder is molded by a known molding method, such as cold isostatical press (CIP) or powder press molding with a mold, with a molding pressure in a range from 78 to 120 MPa. The molded compact is cut to obtain a desirable shape approximate to the substrate 4. The molded compact is sintered in an ambient atmosphere at a temperature in a range from 1500° C. to 1700° C.

If the substrate 4 is made of silicon carbide, at least powder of a boron compound and powder of a carbon compound are added as additives to silicon carbide powder, which is a principal component, and thus base powder is obtained. The base powder is molded by a known molding method and a molded compact is obtained. The molded compact is sintered in an inert atmosphere such as Ar. The obtained molded compact is sintered in vacuum or in an inert atmosphere such as Ar at a temperature ranging from 1900° C. to 2100° C. Further, to reduce voids, the compact may be processed by hot isostatical process (HIP).

(2) Processing Sintered Compact

The fabricated sintered compact is processed. In particular, the substrate 4 is ground in the thickness direction to obtain a predetermined thickness. The outer end surface of the substrate 4 is processed. The sintered compact with the processed end surface is bored to make the sucking hole 10.

Then, the surface where the protrusions 12, the annular seal portion 34, and the recessed portion, which becomes the first portion 9, are formed is processed by blasting. Thus, the plurality of protrusions 12, the annular seal portion 34, and the recessed portion are formed. Before blasting, a mask (non-processing region) is provided on portions which become the protrusions 12 and the annular seal portion 34, and a portion where no recess is formed.

The heights of the plurality of protrusions 12 and the annular seal portion 34 typically become uneven. Hence, lapping is performed to equalize the heights of the plurality of protrusions 12 and the annular seal portion 34.

(3) Joining Contact Portion and Holding Member

Next, the protruding members 15a and 15b, which become the contact portions, and the holding member 28 are joined to the substrate 4. These members may be joined to the substrate 4 after the substrate 4 is fabricated in the processes (1) and (2). Alternatively, these members may be integrally formed with the substrate 4 through the processes (1) and (2).

Second Embodiment

Figure 11A:
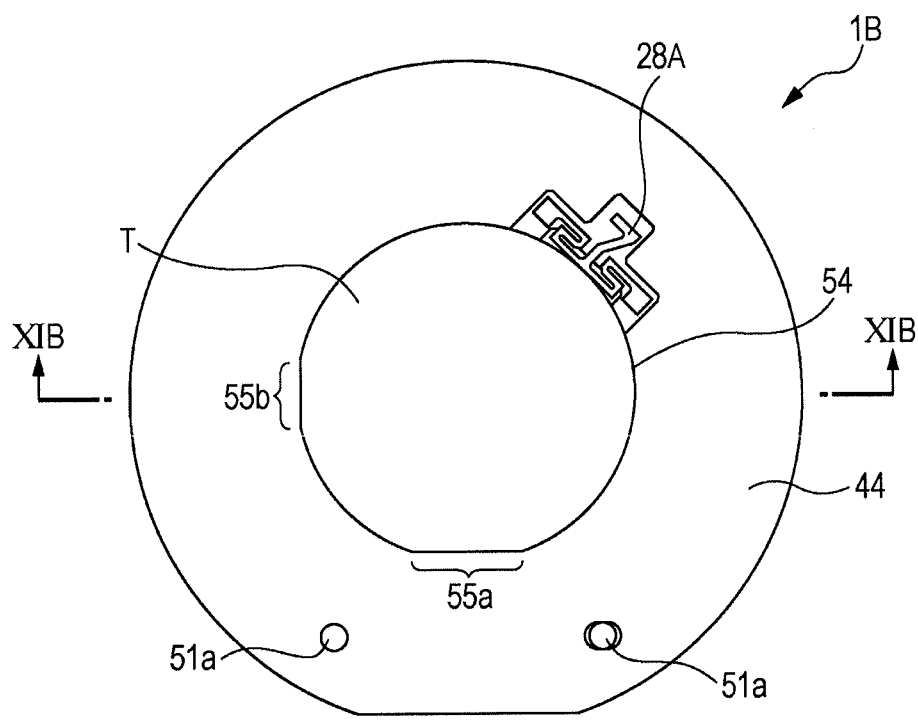
FIG. 11A is a plan view illustrating an chucking member according to a second embodiment of the present invention when the chucking member is mounted on an chucking stage and a target is sucked on the chucking member.
Figure 11B:
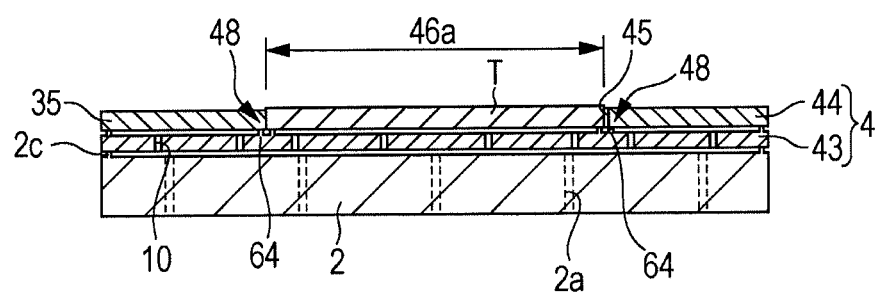
FIG. 11B is a cross-sectional view taken along line XIB-XIB in FIG. 11A.
Figure 12:
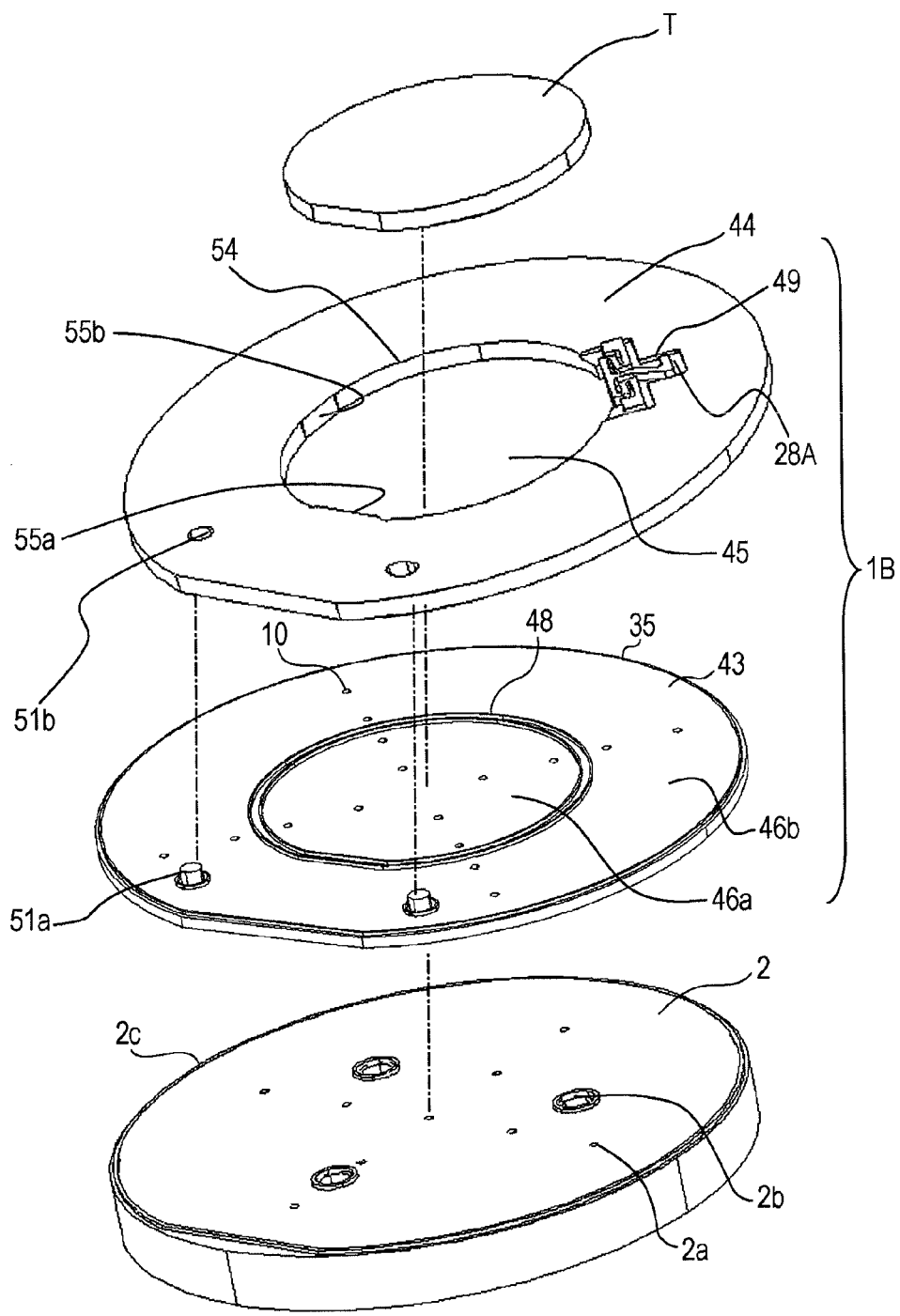
FIG. 12 is a perspective view illustrating the chucking stage, the target, and the chucking member according to the second embodiment of the present invention, which are separated from one another.

Referring to FIGS. 11A, 11B, and 12, an chucking member 1B according to a second embodiment of the present invention includes a base member 43 that is mounted on an chucking stage 2, and a cover member 44 that is removably mounted on the base member 43. The cover member 44 has an opening 45. A target T is located inside the opening 45. The base member 43 and the cover member 44 correspond to the substrate 4 of the chucking member 1A according to the first embodiment. This embodiment represents an embodiment in which the substrate 4 includes the base member 43 and the cover member 44. The cover member 44 functions as the vacuum inhibition region 8 according to the first embodiment. Hereinafter, the same reference numerals are applied to the same components as those according to the first embodiment, and hence the redundant description is omitted.

The base member 43 includes vacuum regions 46a and 46b that allow gas to be vacuumed through vacuum holes 2a (if the vacuum regions 46a and 46b are not distinguished, the regions are merely respectively referred to as the "vacuum region 46"), and a non-vacuum region 48 that inhibits the gas from being vacuumed through the vacuum holes 2a. The base member 43 includes sucking holes 10 in the vacuum region 46 and does not include sucking holes 10 in the non-vacuum region 48. The vacuum region 46a has a circular shape. The vacuum region 46b and the non-vacuum region 48 have annular shapes. Referring to FIG. 12, the non-vacuum region 48 is provided around the vacuum region 46a at the center, and the vacuum region 46b is provided around the non-vacuum region 48.

The vacuum region 46 has a plurality of sucking holes 10. When the target T is mounted on the vacuum region 6, the gas is vacuumed through the vacuum holes 2a in the chucking stage 2 and through the sucking holes 10. Thus, the target T is sucked on the chucking stage 2 through the base member 43. When the vacuuming is stopped, the target T is released from the sucking. The target T can be removed from the chucking stage 2 and the base member 43.

When the gas is vacuumed through the vacuum holes 2a in the chucking stage 2, the base member 43 is sucked on the chucking stage 2. When the vacuuming is stopped, the base member 43 is released from the sucking. As described above, the base member 43 can be mounted on the chucking stage 2 when the sucking force is applied to the base member 43 or removed from the chucking stage 2 when the base member 43 is released from the sucking force. When the gas is vacuumed through the vacuum holes 2a and the sucking holes 10, the target T and the base member 43 can be simultaneously sucked on the chucking stage 2.

The cover member 44 has an opening 45. The cover member 44 is mounted on the base member 43 such that an inner circumferential edge 54 of the cover member 44 adjacent to the opening 45 is located above the non-vacuum region 48 in plan view. The cover member 44 covers the vacuum region 46b located around the vacuum region 46a. The target T is sucked on the chucking stage 2 through the vacuum region 46a.

Since the base member 43 including the plurality of vacuum regions 46 and the non-vacuum region 48 is mounted on the chucking stage 2, and the cover member 44 having the opening 45 corresponding to the size of the target T is mounted on the base member 43, the cover member 44 and the target T can be sucked on the base member 43 with the non-vacuum region 48 interposed between the cover member 44 and the target T.

When the target T is sucked on the chucking stage 2, the base member 43 including the plurality of vacuum regions 46 is mounted on the chucking stage 2, and the cover member 44 is mounted on the base member 43 such that at least one of the plurality of vacuum regions 46 is located inside the opening 45 and the other vacuum region 46 is covered with the cover member 44. Accordingly, when the target T is arranged in the vacuum region 46 located inside the opening 45, the target T can be stably attracted and held. That is, when the chucking member 1B according to this embodiment is used, a target T with a smaller size than the size of the vacuum hole formation region of the chucking stage 2 can be stably attracted and held.

Also, the cover member 44 may be removed, and a target T may be arranged to cover all the plurality of vacuum regions 46 of the base member 43, so that the target T is attracted and held. Thus, with the chucking member 1B, targets T with different sizes may be stably attracted and held.

The base member 43 includes at least two positioning projections 51a that are used for positioning the cover member 44 to the base member 43. The cover member 44 has positioning holes 51b corresponding to the positioning projection 51a. The cover member 44 illustrated in FIG. 12 has two positioning holes 51b. The positioning projection 51a provided at the base member 43 are inserted into the positioning holes 51b of the cover member 44. Accordingly, the relative positions of the base member 43 and the cover member 44 can be fixed. The number of positioning projection 51a and the number of positioning holes 51b each are not limited to two, and at least a single positioning member 51a and a single positioning hole 51b may be provided. However, two or more positioning members and two or more positioning hole are preferably provided for precisely positioning the base member 43 and the cover member 44.

When a single positioning projection 51a positioning hole 51b are provided, they are preferably in the shape of, for example, plasmatic column so that the positioning projection 51a does not rotate inside the positioning hole 51b. The positioning hole 51b may include a through hole, a concave portion and so on.

The cover member 44 includes contact parts 55a and 55b that are provided at the inner circumferential edge 54 and contact the target T, and a holding member 28 that presses the target T against the contact parts 55a and 55b. The cover member 44 includes a recessed portion 49 at a surface. Fixed portions 28b of the holding member 28 are fixed to a side wall of the recessed portion 49. The holding member 28 presses the target T against the contact parts 55a and 55b, and retains the target T within the opening 45 of the cover member 44.

Since the opening 45 is a through hole, the inner circumferential edge 54 corresponds to a side wall surface of the through hole. The contact parts 55a and 55b are flat portions provided at part of the side wall surface. The holding member 28 presses a side surface located at the outer circumference of the target T against the contact parts 55a and 55b, and retains the target T. The target T can be relatively easily retained. Thus, even if the target T is repeatedly mounted on and removed from the chucking stage 2, such work is not troublesome. Here, at least one contact part 55 may be provided. The material of the holding member 28 may be preferably resin or zirconium oxide ceramic.

The opening 45 is in the substantially same shape as the target T. When the target T has circular shape, the opening 45 has circular shape. Referring to FIG. 12, if the target T is a silicon wafer, the silicon wafer may have an orientation flat that indicates the orientation of the silicon wafer. In this case, the inner circumferential edge of the opening 45 may have a line portion corresponding to the orientation flat.

The base member 43 may include an annular seal portion 64 in the non-vacuum region 48. The annular seal portion 64 is, for example, an annular wall, and is formed of an annular protrusion (referred to as "inner protrusion" in this embodiment). In this case, the outer circumferential edge of the target T and the inner circumferential edge 54 of the cover member 44 are mounted on the inner protrusion. Further, in this case, an annular wall 35 is provided at an outer circumferential portion of the base member 43. The annular wall 35 is an annular protrusion (referred to as "outer protrusion" in this embodiment). The outer circumferential edge of the cover member 44 is mounted on the outer protrusion. With this configuration, gas in a space surrounded by the inner protrusion, the surface of the base member 43, and the surface (or a surface facing the base member 43) of the target T is vacuumed through the vacuum holes 2a and the sucking holes 10. Thus, the target T can be sucked on the chucking stage 2 through the base member 43. Also, gas in a space surrounded by the inner protrusion, the outer protrusion, the surface of the base member 43, and the surface (or a surface facing the base member 43) of the cover member 44 is vacuumed through the vacuum holes 2a and the sucking holes 10. Thus, the cover member 44 can be sucked on the chucking stage 2. The inner protrusion and the outer protrusion may preferably have the same height to support the cover member 44 and the target T in a flat posture.

Third Embodiment

Next, an chucking member 1C according to a third embodiment of the present invention is described. The chucking member 1C of this embodiment is suitably used when a target T is selected from a plurality of targets T with different sizes and is sucked on an chucking stage 2. The same reference signs are applied to the same components as those according to the second embodiment. The advantage of the components is similar to that according to the second embodiment, and hence the redundant description is occasionally omitted.

Referring to FIGS. 13A to 13C, 14, 15A and 15B, and 16A to 16D, the chucking member 1C includes a base member 43 that is mounted on the chucking stage 2, and a plurality of cover members 44a, 44b, and 44c corresponding to plurality of targets T (if the cover members 44a to 44c are not distinguished, the members are merely respectively referred to as the "cover member 44"). The plurality of cover members 44a, 44b, 44c are removably mounted on the base member 43. The plurality of cover members 44a to 44c have openings 45 with different sizes.

Figure 14:
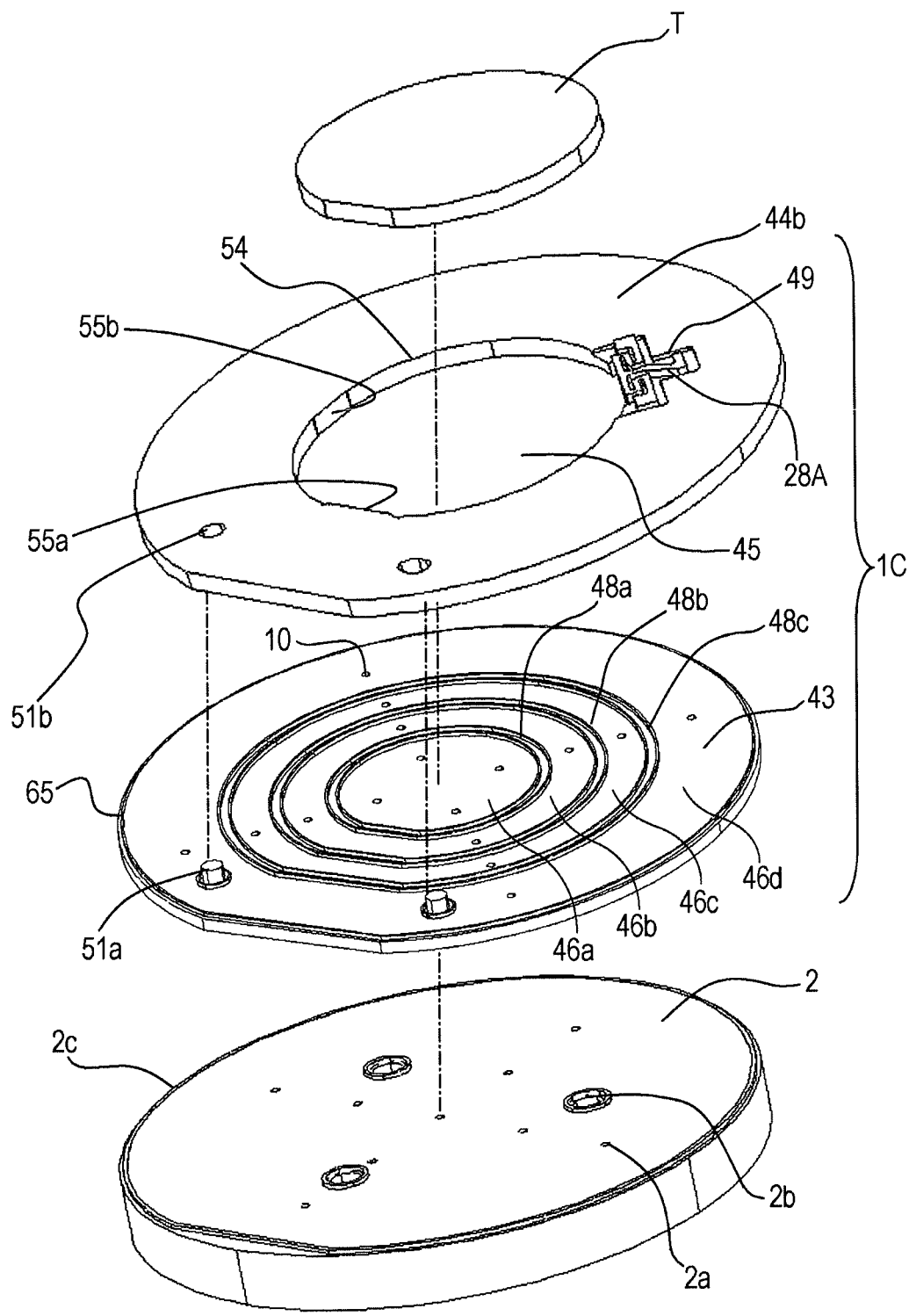
FIG. 14 is a perspective view illustrating the chucking stage, the target, and the chucking member according to the third embodiment of the present invention, which are separated from one another.
Figure 15A:
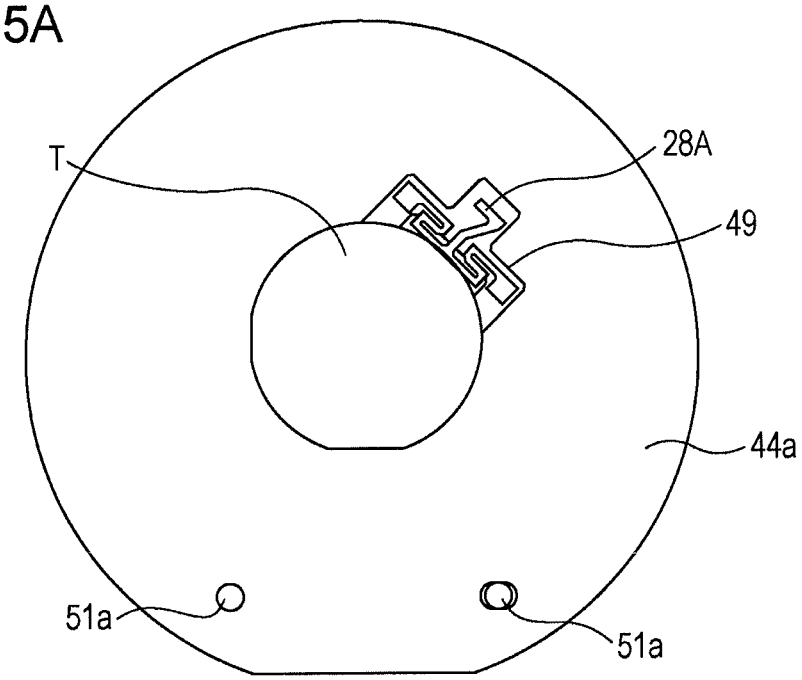
FIGS. 15A and 15B are plan views each illustrating an chucking member according to the third embodiment of the present invention when the chucking member is mounted on the chucking stage and a target is sucked on the chucking member.
Figure 15B:
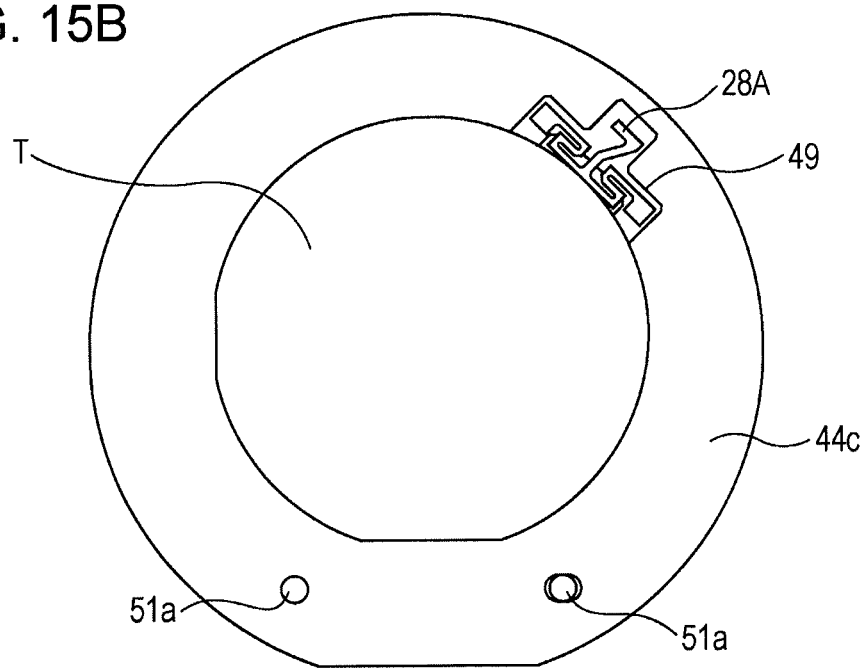

For example, the target T and the openings 45 have circular shapes. Referring to FIG. 14, if the target T is a silicon wafer, the silicon wafer may have an orientation flat that indicates the orientation of the silicon wafer. In this case, the inner circumferential edge of the opening 45 may have a line portion corresponding to the orientation flat.

The base member 43 includes vacuum regions 46a, 46b, 46c, and 46d that allow gas to be vacuumed through the vacuum holes 2a (if the vacuum regions 46a to 46d are not distinguished, the regions are merely respectively referred to as the "vacuum region 46"), and non-vacuum regions 48a, 48b, and 48c that not allow the gas to be vacuumed through the vacuum holes 2a (if the non-vacuum regions 48a to 48c are not distinguished, the regions are merely respectively referred to as the "non-vacuum region 48") (see FIGS. 14 and 16A to 16D). The vacuum region 46a has a circular shape, and the vacuum regions 46b to 46d, and the non-vacuum regions 48a to 48c have annular shapes. Referring to FIG. 16A, the vacuum regions 46 and the non-vacuum regions 48 are alternately arranged from an inner edge toward an outer edge of the base member 43 in a plan view of the base member 43. In particular, the non-vacuum region 48a is provided around the vacuum region 46a at the center, and the annular vacuum region 46b is provided around the non-vacuum region 48a. Then, the non-vacuum region 48b, the vacuum region 46c, the non-vacuum region 48c, and the vacuum region 46d are arranged in that order from the center toward the outer circumference of the base member 43.

The base member 43 includes a plurality of sucking holes 10 in the vacuum region 46. When the target T is mounted on the vacuum region 46, the gas is vacuumed through the vacuum holes 2a in the chucking stage 2 and through the sucking holes 10. Thus, the target T is sucked on the chucking stage 2 through the base member 43. When the vacuuming is stopped, the target T is released from the attraction. Thus, the target T can be removed from the chucking stage 2 and the base member 43.

When the gas is vacuumed through the vacuum holes 2a in the chucking stage 2, the base member 43 is sucked on the chucking stage 2. When the vacuuming is stopped, the base member 43 is released from the attraction. As described above, the base member 43 can be mounted on or removed from the chucking stage 2 when the attraction force is applied to the base member 43 or the base member 43 is released from the attraction force. When the gas is vacuumed through the vacuum holes 2a and the sucking holes 10, the target T and the base member 43 can be simultaneously sucked on the chucking stage 2.

Each of the cover members 44a to 44c is mounted on the base member 43 such that each of inner circumferential edges 54 of the cover members 44a to 44c adjacent to the openings 45 is located above corresponding one of the non-vacuum regions 48a to 48c. The cover member 44b illustrated in FIGS. 13A to 13C and 14 is mounted on the base member 43 such that the inner circumferential edge 54 of the opening 45 is located in the non-vacuum region 48b.

The cover members 44 are prepared by the same number as the number of vacuum regions excluding the outermost vacuum region 46 of the base member 43. For example, regarding the chucking member 1C according to this embodiment, three types of cover members 44a to 44c corresponding to the vacuum regions 46a to 46c excluding the outermost vacuum region 46d are prepared. Thus four types of targets T with different sizes can be sucked on the chucking stage 2 such as when the three types of cover members 44a to 44c are used, and when no cover member is used. Each of the cover members 44a to 44c is mounted on the base member 43 to entirely cover the corresponding vacuum region or regions 46 located outside the corresponding non-vacuum region or regions 48.

Figure 13A:
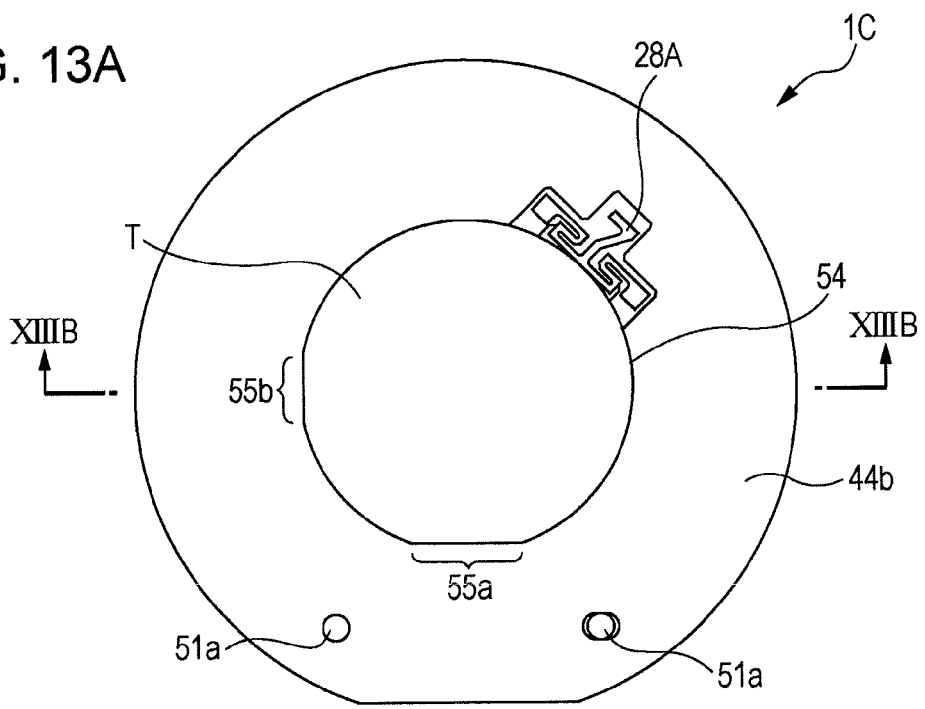
FIG. 13A is a plan view illustrating an chucking member according to a third embodiment of the present invention when the chucking member is mounted on an chucking stage and a target is sucked on the chucking member.
Figure 13B:
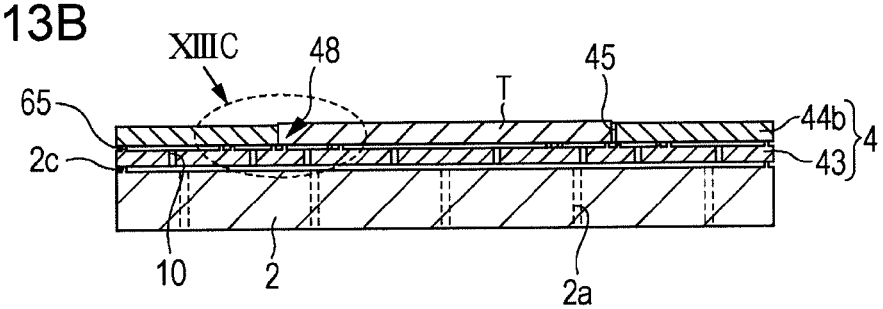
FIG. 13B is a cross-sectional view taken along line XIIIB-XIIIB in FIG. 13A.
Figure 13C:
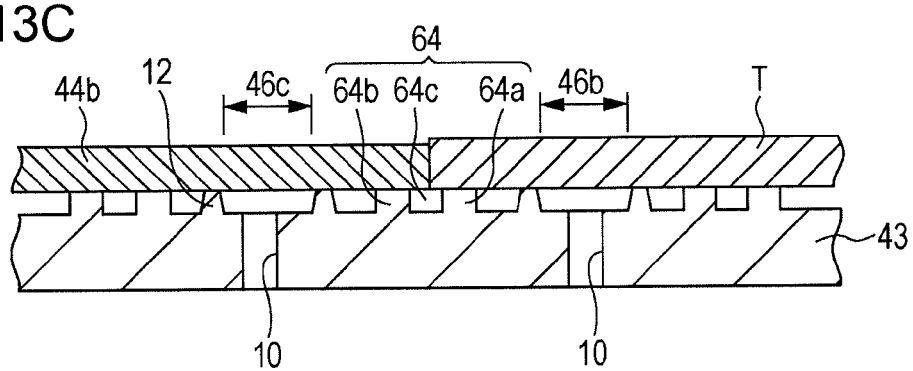
FIG. 13C is a partly enlarged view of an area XIIIC surrounded by a broken line in FIG. 13B.

For example, referring to FIG. 13C, the vacuum regions 46c and 46d are covered with the cover member 44b, and the target T is sucked on the vacuum regions 46a and 46b. The cover member 44a illustrated in FIG. 15A covers the vacuum regions 46b to 46d, so that the target T is sucked on the vacuum region 46a. The cover member 44d illustrated in FIG. 15B covers the vacuum region 46d, so that the target T is sucked on the vacuum regions 46a to 46c.

When the target T is sucked on the chucking stage 2, the base member 43 including the vacuum regions 46 and the non-vacuum regions 48 is mounted on the chucking stage 2, and the cover member 44 having the opening 45 corresponding to the size of the target T is mounted on the base member 43. Thus, the cover member 44 and the target T can be sucked on the base member 43 with the non-vacuum region 48 interposed between the cover member 44 and the target T.

When the chucking member 1C according to this embodiment is used, similarly to the chucking member 1B, a target T with a smaller size than the size of the vacuum hole formation region of the chucking stage 2 can be stably attracted and held. Also, when the cover member 44 is mounted or removed, or when one of the cover members 44a to 44c having the openings 45 with the different sizes is selectively used, any of the four types of targets T with the different sizes can be stably sucked on and held by the chucking stage 2.

Referring to FIGS. 13C and 16A to 16C, the plurality of vacuum regions 46 each have a plurality of protrusions 12. Also, the non-vacuum regions 48 respectively include annular seal portions 64. For example, referring to FIGS. 13C and 16C, the non-vacuum region 48b includes an annular seal portion 64. The annular seal portion 64 includes a pair of annular walls 64a and 64b, and a region 64c surrounded by the annular walls 64a and 64b. The pair of annular walls 64a and 64b provide double annular walls. The annular wall 64b is provided outside the annular wall 64a. The region 64c is formed between the annular walls 64a and 64b. The region 64c does not have a sucking hole 10 unlike the vacuum region 46. The region 64c does not suck the target. That is, the region 64c inhibits gas from being vacuumed through the vacuum holes 2a.

The annular walls 64a and 64b preferably have equivalent heights, which are the same as the height of the plurality of protrusions 12. As long as the annular walls 64a and 64b have the same height as the plurality of protrusions 12, when the target T is sucked on the base member 43, the flatness of the target T can be highly precisely maintained.

Further, an annular wall 65 is provided at an outer circumferential portion of the base member 43. The annular wall 65 preferably has the same height as the annular walls 64a and 64b, and the protrusions 12.

When the cover member 44b is mounted on the base member 43, the cover member 44 contacts the annular wall 64b that is close to the vacuum region 46c, and the target T contacts the annular wall 64a that is close to the vacuum region 46b. In this state, if gas is vacuumed through the vacuum holes 2a of the chucking stage 2 and the sucking holes 10 of the base member 43, the cover member 44 is sucked on an area outside the region 64c by vacuum attraction, and the target T is sucked on an area inside the region 64c by vacuum attraction.

More specifically, gas in a space surrounded by the annular wall 64a, the surface of the base member 43, and the surface (or a surface facing the base member 43) of the target T is vacuumed through the vacuum holes 2a of the chucking stage 2 and the sucking holes 10. Thus, the target T can be sucked on the chucking stage 2. Also, gas in a space surrounded by the annular wall 64b in the non-vacuum region 48c, the annular wall 65 located at the outer circumferential portion of the base member 43, the surface of the base member 43, and the surface (or a surface facing the base member 43) of the cover member 44 is vacuumed through the vacuum holes 2a of the chucking stage 2. Thus, the cover member 44 can be sucked on the chucking stage 2.

The above-described configuration of the non-vacuum region 48b may be applied to the non-vacuum regions 48a and 48c. The configuration of the annular seal portion 64 is not limited to the above-described configuration, and may be any configuration as long as the configuration includes an annular protrusion. That is, the annular seal portion 64 may have double annular walls including the annular walls 64a and 64b. Alternatively, the annular seal portion 64 may include a single annular wall. If the double annular walls including the annular walls 64a and 64b are provided, the target T and the cover member 44 can be respectively mounted on the different annular walls. The target T and the cover member 44 can be further reliably and stably mounted on the annular seal portion 64. The protrusion that provides the non-vacuum region 48 supports the outer circumferential portion of the target T and the inner circumferential edge 54 of the opening 45. When the protrusion supports the inner circumferential edge 54 of the opening 45, the protrusion may support the portion proximity to the inner circumferential edge 54 of the opening 45.

The configuration of the annular wall 65 provided at the outer circumferential portion of the base member 43 is not limited to the above-described configuration, and may be any configuration as long as the configuration includes an annular protrusion. The protrusion in this case supports the outer circumferential portion of the cover member 44. The positioning projection 51a provided at the base member 43 are inserted into the positioning holes 51b of the cover member 44. Accordingly, the relative positions of the base member 43 and the cover member 44 can be fixed. FIG. 16D is a cross portion of the positioning member 51a taken along line XVID-XVID in FIG. 16A. The positioning member 51a is fixed to the base member 43 by an adhesive or the like, so that the relative positional relationship between the positioning member 51a and the base member 43 is not changed. The positioning member 51a has, for representative example, a columnar shape. The annular wall 64d surrounds a region provided with the positioning member 51a, and the annular wall 64e surrounds the annular wall 64d. Tops of the annular walls 64d and 64e have the same height as the plurality of protrusions 12 and the annular walls 64a and 64b.

The number of positioning projection 51a and the number of positioning holes 51b each are not limited to two, and at least a single positioning member 51a and a single positioning hole 51b may be provided. However, two or more positioning members and two or more through holes are preferably provided for precisely positioning the base member 43 and the cover member 44. The outer diameter of the positioning member 51a and the inner diameter of the though hole 51b are determined to have a tolerance of fitting. One of the positioning holes 51b is preferably an elongated hole (see FIGS. 15A, 15B, and 17A), because a tolerance of positioning between the plurality of positioning projection 51a does not have to be strictly determined.

The plurality of cover members 44 each include contact parts 55a and 55b that are provided at the inner circumferential edge 54 and contact the target T, and a holding member 28 that presses the target T against the contact parts 55a and 55b.

The holding member 28 presses the target T against the contact parts 55a and 55b, and retains the position of the target T. The target T can be relatively easily retained. Thus, even if the target T is repeatedly mounted on and removed from the chucking stage 2, such work is not troublesome. Here, at least one contact part 55 may be provided.

The configuration of the cover member 44 is described in more detail below. The inner circumferential edge of the cover member 44 comprises a first line portion 56a which serves as the contact part 55a, and a second line portion 56b which serves as the contact part 55b. The second line portion 56b is arranged in a direction different from the direction in which the first line portion 56a is arranged. When an imaginary region is formed by extending linearly the contact portion of the holding member in expanding or contracting direction of the extendable portions, the imaginary region intersects the inner circumferential edge of the opening 54 between the first line portion 56a and the second line portion 56b. In this case, when the target T is pressed by the contact portion 28a, the target T is pressed against the first line portion 56a and the second line portion 56b, and thus, the target T can be stably arranged inside the opening 45.

Further, the configuration of the cover member 44 may be as described bellow. Referring to FIG. 17A, when the cover member 44 is illustrated in plan view, the inner circumferential edge 54 of the opening 45 includes a plurality of line portions that serve as the contact parts 55a and 55b against the target T, and a plurality of arc portions 57a, 57b, and 57c extending along the circumference of a predetermined circle (an imaginary circle). The line portions 56a and 56b include a first line portion 56a and a second line portion 56b that is shorter than the first line portion 56a. When a first imaginary line connects a center point C0 of the predetermined circle and a center point C1 of the first line portion 56a and a second imaginary line connects the center point C0 of the predetermined circle and a center point C2 of the second line portion 56b, an angle between the first imaginary line and the second imaginary line is a right angle.

Also, when the target T is circle shape, the contact area of the contact portion 28a of holding member 28 contacts the surface of the outer circumference of the target T at a point in plan view. Thus, in plan view, an angle formed by the first imaginary line connecting the center point C1 of the first line portion 56a and the center point C0 of the predetermined circle, and a third imaginary line connecting a contact area of the contact portion 28a of the holding member 28 (described later) and the center point C0 of the predetermined circle is larger than an angle formed by the second imaginary line connecting the center point C2 of the second line portion 56b and the center point C0 of the predetermined circle, and a forth imaginary line connecting the center point C0 of the predetermined circle and the contact area of the contact portion 28a of the holding member 28. When the holding member 28B' is used, the contact portion 28a of holding member 28 contacts the surface of the outer circumference of the target T along the curved line in plan view. In this case, a center point of the curved line is regarded as the contact point. Accordingly, a larger force is exerted on the first line portion 56a than a force exerted on the second line portion 56b. The target T can be stably arranged inside the opening 45. As the result, even if the target T repeatedly contacts the contact parts 55a and 55b by using the holding member 28, the position of the target T is hardly changed relative to the position of the cover member 44.

With the above-described configuration, even though the dimension in the radial direction of the target T varies, the target T can be stably retained by the holding member 28 and the contact parts 55a and 55b, and it can be suppressed that the target T is rotated along the inner circumferential edge 54 of the opening 45. With this configuration, the target T can be positioned in the opening 45 with a high positioning precision. The cover member 44 has been described above with reference to the plan view. Since the opening 45 is a through hole, the inner circumferential edge 54 corresponds to a side wall surface of the through hole. Thus, the contact parts 55a and 55b are flat portions provided at part of the side wall surface. The arc portions are curved portions provided at part of the side wall surface. The force exerted on the line portion is a force exerted on the flat portion provided at the side wall surface of the through hole, which serves as the opening 45.

With the chucking member 1C according to this embodiment, targets T with different sizes can be sucked on the chucking stage 2 with high positioning precisions.

The chucking member 1B or 1C and the chucking stage 2 on which the chucking member 1B or 1C is mounted according to the second or third embodiment define an chucking device. The chucking device may further include a vacuum pump (not illustrated) to decrease the pressure in the vacuum holes 2a of the chucking stage 2.

The surface of the base member 43, which faces with the chucking stage 2, is preferably concave (the degree of the concave is preferably 20-200 micro meters). In this case, when the ejector pin is lowered and the base member 43 is mounted on the chucking stage 2, the outer circumference portion of the base member 43 touches with an annular wall 2c of the chucking stage 2 earlier than the case where the surface of the base member 43 is flat. Thus, the vacuuming the enclosed space surrounded by the annular wall 2c, the chucking stage 2, and a surface of the base member 43 can be started earlier. Thus, the speed of mounting the base member 43 is improved, and therefore, the throughput of the processing target T is improved. This concave shape can be also applied to the surface of the substrate 4.

The material of the base member 43 and the cover member 44 of the chucking member 1B or 1C according to the second or third embodiment is preferably ceramic, and, more particularly, an alumina sintered compact or a silicon carbide sintered compact.

A manufacturing method of the base member 43 and the cover member 44 when the members are made of ceramic is substantially similar to the manufacturing method of the substrate 4 described in the first embodiment. If the cover member 44 is fabricated in the process (2) Processing Sintered Compact, boring is performed for forming the opening 45 and the positioning hole 51b in the sintered compact with the processed end surface. Further, when the base member 43 is formed, the surface where the protrusions 12 and the annular seal portions 35, 64 are formed is processed by blasting. And when the cover member 44 is formed, the surface where the recessed portion 49 is formed is processed by blasting. Then, in the process (3) Joining Positioning Member and Holding Member, the positioning member 51a and the holding member 28 are respectively joined with the base member 43 and the cover member 44.

Fourth Embodiment

Referring to FIG. 18, a charged particle beam apparatus according to an embodiment of the present invention includes an chucking device 69 that uses the chucking member 1A according to the first embodiment, and a charged particle beam source 71 that irradiates a target T mounted on the chucking device 69 with a charged particle beam 70. The charged particle beam 70 may be selected from an electron beam and an ion beam. If the charged particle beam apparatus is, for example, an exposure apparatus, the charged particle beam 70 is an electron beam.

The charged particle beam apparatus includes an aperture of the charged particle beam source 71 from which the charged particle beam is emitted, and a vacuum chamber 72 including the chucking device 69.

Next, an exemplary method for using the chucking member 1A is described with reference to a flowchart illustrated in FIG. 19. A case will be described in which the target T is exposed with a beam in the exposure apparatus. The chucking member 1A is prepared, and the target T is arranged in the vacuum region 6 of the substrate 4. If the holding member 28 illustrated in FIG. 14 is employed, the pull portion 28d which is part of the center portion of the holding member 28 is pulled, so that the center portion of the holding member 28 is moved away from the target T in a first direction, and the target T can be arranged in the vacuum region 6. Then, the pull portion 28d is restored, so that the target T contacts the protrusion which serve as the contact part 15. Accordingly, the target T is retained in the vacuum region 6.

The chucking member 1A with the target T mounted is placed at a target inlet (not illustrated) of the exposure apparatus (not illustrated). The chucking member 1A is then conveyed from the inlet and placed on the chucking stage 2 of the exposure apparatus by using a conveying jig or the like. When gas is vacuumed through the vacuum holes 2a of the chucking stage 2, the gas is vacuumed through the sucking holes 10 of the substrate 4. As the result, the pressure in the vacuum region 6 surrounded by the annular seal portion 34 decreases, and the target T is sucked on the substrate 4. An alignment mark (or a mark for detecting a position) marked on the target T is detected, so that the position of the target T is correctly detected. Then, the target T is irradiated with the charged particle beam 70, so that the target T is exposed with a beam.

When the target T is irradiated with light, such as ultraviolet light, even if the same exposure apparatus is used, the charged particle beam source 71 is replaced with a light source, and the target T is irradiated with light instead of the electron beam.

Next, an exemplary method for using the chucking member 1B is described with reference to a flowchart illustrated in FIG. 20. A case is described in which the target T is exposed with a beam in the exposure apparatus. First, the cover member 44 is mounted on the base member 43. The positioning projection 51a provided at the base member 43 are inserted into the positioning holes 51b of the cover member 44 so that the position of the base member 43 is not deviated relative to the cover member 44 mounted on the base member 43. The inner circumferential edge 54 of the cover member 44 is mounted on the vacuum inhibition region 8 of the base member 43.

The target T is fitted into the opening 45 of the cover member 44 mounted on the base member 43. At this time, the pull portion 28d of the holding member 28 is pulled, so that the contact portion 28a of the holding member 28 is moved away from the target T, i.e., from the opening 45 in the Y direction. Thus, the target T can be fitted into the opening 45. Then, the pull portion 28d is restored, so that the target T contacts the first and second line portions (contact portions) 56a and 56b provided at the inner circumferential edge 54 of the cover member 44. The relative positions of the cover member 44 mounted on the base member 43 and the target T are fixed.

The chucking member 1B with the target T mounted is placed at a target inlet (not illustrated) of the exposure apparatus. The chucking member 1B is then conveyed from the inlet and placed on the chucking stage 2 of the exposure apparatus by using a conveying jig or the like. When gas is vacuumed through the vacuum holes 2a of the chucking stage 2, the gas is vacuumed through the sucking holes 10 of the base member 43. As the result, the pressure in the vacuum region 6 surrounded by the annular seal portion 64 decreases, and the target T and the cover member 44 are attracted. An alignment mark (or a mark for detecting a position) marked on the target T is detected, so that the position of the target T is correctly detected. Then, the target T is irradiated with the electron beam, so that the target T is exposed with the beam.

When the target T is irradiated with light, such as ultraviolet light, even if the same exposure apparatus is used, the charged particle beam source 71 is replaced with a light source.

In this case, the base member 43 preferably has a small reflectivity for irradiated light 70. If the reflectivity is small, even though a target T can transmits light like a sapphire substrate, the irradiated light 70 is less likely to be reflected by the surface of the base member 43 after the light passes through the target T. Thus, a situation, in which the light is reflected by the surface of the base member 43, is reflected again by the back surface (or a surface of the target T facing the base member 43) of the target T, and hence the back surface of the target T is unintentionally processed, can be avoided. For example, if the charged particle beam 70 has a wavelength corresponding to ultraviolet light, the base member 43 is made of black alumina having a lightness smaller than 60. The substrate 4 may be made of black alumina for a similar reason.

What is claimed is:

1. A chucking member for holding a target removably mounted on a chucking stage with a plurality of vacuum holes, comprising:
   a substrate removably mounted on the chucking stage and comprising:
      a first portion within a recessed surface of the substrate, the first portion comprising a vacuum region in which the target is to be arranged, the vacuum region allowing gas to be vacuumed through at least one of the plurality of the vacuum holes; and
      a second portion other than the first portion, the second portion comprising a vacuum inhibition region provided around the vacuum region, the vacuum inhibition region covering another vacuum hole to inhibit the gas from being vacuumed therethrough;
   a holding member on the first portion; and
   a contact part on the first portion;
   wherein the target contacts the contact portion when the target is to be arranged in the vacuum region, and
   the holding member presses the target in a pressing direction against the contact part to hold the target between the holding member and the contact part.

2. The chucking member according to claim 1,
   wherein the vacuum region comprises a plurality of protrusions for supporting the target in the vacuum regions, and
   the plurality of protrusions having heights equivalent to a height of a surface of the second portion.

3. A chucking device comprising:
   a chucking stage having a plurality of vacuum holes; and
   the chucking member according to claim 1.

4. An exposure apparatus comprising:
   the chucking device according to claim 3; and
   a source operable to irradiate a target which is to be mounted on the chucking device with a charged particle beam or light.

5. A chucking member for holding a target removably mounted on a chucking stage with a plurality of vacuum holes, comprising:
- a substrate removably mounted on the chucking stage and comprising:
  - a vacuum region in which the target is to be arranged, the vacuum region allowing gas to be vacuumed through a least one of the plurality of the vacuum holes;
  - a vacuum inhibition region surrounding the vacuum region, the vacuum inhibition region covering another vacuum hole to inhibit the gas from being vacuumed therethrough; and
  - a contact part arranged at the vacuum inhibition region, the contact part contacted with the target when the target is to be arranged in the vacuum region; and
- a holding member for pressing the target in a pressing direction against the contact part to hold the target between the holding member and the contact part, comprising:
  - a contact portion to be in contact with the target,
  - a plurality of fixed portions fixed to the substrate at both sides of the contact portion in a plan view, and
  - a plurality of extendable portions, each of which connects the contact portion with each of the fixed portions, the extendable portions expanding or contracting in the pressing direction, and
  - a pull portion connected with the contact portion to move the contact portion in the pressing direction or a direction opposite to the pressing direction, the pull portion being between the plurality of fixed portion.

6. The chucking member according to claim 5, wherein a plurality of the contact parts comprises:
- a first contact part which is a columnar protruding member; and
- a second contact part which is a rectangular protruding member.

7. The chucking member according to claim 5, wherein the plurality of extendable portions is bent in a single U-shape.

8. The chucking member according to claim 5, wherein the pull portion has an empty hole.

9. A chucking member for holding a target removably mounted on a chucking stage with a plurality of vacuum holes, comprising:
- a substrate removably mounted on the chucking stage and comprising:
  - a base member comprising a vacuum region in which the target is to be arranged, the vacuum region allowing gas to be vacuumed through at least one of the plurality of the vacuum holes; and
  - a cover member comprising a vacuum inhibition region providing a wall surrounding the vacuum region, the wall defining an enclosed space in which to arrange the target, the vacuum inhibition region covering another vacuum hole to inhibit the gas from being vacuumed therethrough, the cover member removably mounted on the base member and having an opening inside which the target is to be arranged.

10. The chucking member according to claim 9, wherein the base member comprises:
- a plurality of the vacuum regions, and
- wherein the cover member is mounted on the base member such that at least one of the vacuum regions of the base member is located inside the opening of the cover member and the other vacuum regions of the base member are covered with the cover member.

11. The chucking member according to claim 10, wherein the base member comprises:
- an annular non-vacuum region which does not allow the gas to be vacuumed through the vacuum holes, and wherein the cover member is mounted on the base member such that an inner circumferential edge of the opening is located at the non-vacuum region.

12. The chucking member according to claim 11, wherein the non-vacuum region is between the vacuum regions.

13. The chucking member according to claim 11, wherein the base member comprises:
- a first annular protrusion on which the target is to be arranged, and
- a second annular protrusion provided outside the first protrusion and on which the cover member is to be arranged, and
- wherein the first and second annular protrusions are arranged at the non-vacuum region.

14. The chucking member according to claim 13, wherein the base member further comprises a non-vacuum region provided with a third annular protrusion for supporting the cover member at an outer circumferential portion of the base member.

15. The chucking member according to claim 9, wherein the base member comprises: a plurality of protrusions for supporting the target in the vacuum regions.

16. The chucking member according to claim 9, wherein the base member comprises:
- at least one positioning projection which positions the cover member with respect to the base member, and
- wherein the cover member comprises a positioning hole through which the positioning projection is inserted.

17. The chucking member according to claim 9, further comprising:
- a holding member,
- wherein the inner circumferential edge of the opening of the cover member comprises a contact portion with which the target is in contact, and
- wherein the holding member presses the target in a pressing direction against the contact portion and holds the target between the holding member and the contact portion.

18. A chucking member for holding a target removably mounted on a chucking stage with a plurality of vacuum holes, comprising:
- a substrate removably mounted on the chucking stage and comprising:
  - a vacuum region in which the target is to be arranged, the vacuum region allowing gas to be vacuumed through at least one of the plurality of the vacuum holes; and
  - a vacuum inhibition region providing a wall surrounding the vacuum region, the wall defining an enclosed space in which to arrange the target, the vacuum inhibition region covering another vacuum hole to inhibit the gas from being vacuumed therethrough,
- wherein a surface of the substrate, which faces the chucking stage, is concave.

* * * * *

UNITED STATES PATENT AND TRADEMARK OFFICE
CERTIFICATE OF CORRECTION

PATENT NO. : 8,698,099 B2
APPLICATION NO. : 12/894382
DATED : April 15, 2014
INVENTOR(S) : Tetsuya Inoue Page 1 of 2

It is certified that error appears in the above-identified patent and that said Letters Patent is hereby corrected as shown below:

ON THE TITLE PAGE

In the Abstract, Item (57) line 3, after the word "holes.", delete "the" and insert therefor --The--.

IN THE SPECIFICATION

At column 1, line 57, delete "An" and insert therefor --A--.
At column 1, line 63, after the word "holes", delete "is" and insert therefor --are--.
At column 1, line 64, after the word "and", delete "is" and insert therefor --are--.
At column 2, line 7, delete "An" and insert therefor --A--.
At column 2, line 15, after the word "and", delete "an" and insert therefor --a--.
At column 2, line 18, delete "An" and insert therefor --A--.
At column 2, line 26, after the word "target", delete "which".
At column 2, line 31, after the word "illustrating", delete "an" and insert therefor --a--.
At column 2, line 33, after the word "on", delete "an" and insert therefor --a--.
At column 3, line 6, after the word "illustrating", delete "an" and insert therefor --a--.
At column 3, line 8, after the word "on", delete "an" and insert therefor --a--.
At column 3, line 16, after the word "illustrating", delete "an" and insert therefor --a--.
At column 3, line 18, after the word "on", delete "an" and insert therefor --a--.
At column 3, line 27, after the word "illustrating", delete "an" and insert therefor --a--.
At column 3, line 59, after the word "invention", delete "is" and insert therefor --are--.
At column 3, line 62, delete "An" and insert therefor --A--.
At column 3, line 63, after the word "on", delete "an" and insert therefor --a--.
At column 9, line 32, after the word "define", delete "an" and insert therefor --a--.
At column 9, line 53, after the word "substrate", delete "etc.".
At column 11, line 22, after the word "12,", delete "an" and insert therefor --a--.
At column 11, line 24, after the word "on", delete "an" and insert therefor --a--.
At column 12, line 46, after the word "positioning", delete "projection" and insert therefor --projections--.

Signed and Sealed this
Twenty-second Day of July, 2014

Michelle K. Lee
*Deputy Director of the United States Patent and Trademark Office*

IN THE SPECIFICATION

At column 12, line 51, after the word "positioning", delete "hole" and insert therefor --holes--.
At column 13, line 47, after the word "Next,", delete "an" and insert therefor --a--.
At column 13, line 51, after the word "on", delete "an" and insert therefor --a--.
At column 14, line 11, after the word "that", insert therefor --do--.
At column 17, line 24, after the word "described", delete "bellow" and insert therefor --below--.
At column 17, line 39, after the word "is", insert therefor --a--.
At column 18, line 17, after the word "positioning", delete "precisions" and insert therefor --precision--.
At column 18, line 20, after the word "define", delete "an" and insert therefor --a--.
At column 18, line 63, after the word "includes", delete "an" and insert therefor --a--.
At column 19, line 17, after the word "target", delete "Tin" and insert therefor --T in--.

IN THE CLAIMS

In claim 5, at column 21, line 30, after the word "fixed", delete "portion" and insert therefor --portions--.